(12) United States Patent
Xu et al.

(10) Patent No.: US 12,745,666 B2
(45) Date of Patent: Sep. 22, 2026

(54) PACKAGE STRUCTURES, FABRICATING METHODS THEREOF, AND MEMORY SYSTEMS

(71) Applicant: Yangtze Memory Technologies Co., Ltd., Wuhan (CN)

(72) Inventors: Qi Xu, Wuhan (CN); Chao Wang, Wuhan (CN); Zhiyong Suo, Wuhan (CN); XuHui Wang, Wuhan (CN); Zhen Xu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 416 days.

(21) Appl. No.: 18/491,401

(22) Filed: Oct. 20, 2023

(65) Prior Publication Data

US 2024/0404901 A1 Dec. 5, 2024

(30) Foreign Application Priority Data

May 31, 2023 (CN) ......................... 202310640168.8

(51) Int. Cl.
*H01L 23/31* (2006.01)
*H01L 21/56* (2006.01)
(Continued)

(52) U.S. Cl.
CPC .......... *H10W 74/117* (2026.01); *H10B 80/00* (2023.02); *H10W 20/20* (2026.01);
(Continued)

(58) Field of Classification Search
CPC ... H01L 23/3128; H01L 21/56; H01L 23/481; H01L 23/49816; H01L 23/49822; H01L 24/08; H01L 24/80; H01L 25/0657; H01L 24/16; H01L 24/32; H01L 24/48; H01L 24/73; H01L 2224/08145; H01L 2224/16225; H01L 2224/32225; H01L 2224/48225; H01L 2224/73204; H01L 2224/73257; H01L 2224/73265; H01L 2224/80895; H01L 2224/80896;
(Continued)

(56) References Cited

U.S. PATENT DOCUMENTS

2013/0119528 A1* 5/2013 Groothuis ........... H01L 23/3675
257/777
2014/0319661 A1* 10/2014 Pagaila ................. H01L 23/147
438/618

(Continued)

*Primary Examiner* — Tong-Ho Kim
(74) *Attorney, Agent, or Firm* — Hanley, Flight & Zimmerman, LLC

(57) ABSTRACT

Implementations of the present disclosure disclose a package structure, a fabricating method thereof, and a memory system. The package structure includes: a packaging substrate having a first surface and a second surface opposite the first surface; a semiconductor device on the first surface of the packaging substrate and coupled with the packaging substrate; and a cap layer covering the first surface and encapsulating the semiconductor device, wherein the cap layer and the packaging substrate have a total thickness in a first direction perpendicular to the first surface, and a ratio between a distance from an upper surface of the cap layer to an upper surface of the semiconductor device in the first direction and the total thickness satisfies a first preset value.

20 Claims, 11 Drawing Sheets

(51) Int. Cl.

| | |
|---|---|
| ***H01L 23/00*** | (2006.01) |
| ***H01L 23/48*** | (2006.01) |
| ***H01L 23/498*** | (2006.01) |
| ***H01L 25/065*** | (2023.01) |
| ***H10B 80/00*** | (2026.01) |
| ***H10W 20/20*** | (2026.01) |
| ***H10W 70/685*** | (2026.01) |
| ***H10W 74/01*** | (2026.01) |
| ***H10W 74/10*** | (2026.01) |
| ***H10W 90/00*** | (2026.01) |
| *H10W 72/00* | (2026.01) |
| *H10W 74/15* | (2026.01) |
| *H10W 80/00* | (2026.01) |
| *H10W 90/24* | (2026.01) |

(52) U.S. Cl.

CPC ......... *H10W 70/685* (2026.01); *H10W 74/01* (2026.01); *H10W 90/00* (2026.01); *H10W 90/701* (2026.01); *H10W 72/879* (2026.01); *H10W 72/884* (2026.01); *H10W 74/15* (2026.01); *H10W 80/312* (2026.01); *H10W 80/327* (2026.01); *H10W 90/24* (2026.01); *H10W 90/724* (2026.01); *H10W 90/734* (2026.01); *H10W 90/754* (2026.01); *H10W 90/792* (2026.01)

(58) Field of Classification Search

CPC ....... H01L 2225/06562; H01L 23/3135; H01L 23/562; H01L 25/0652; H01L 2225/06513; H01L 2225/06517; H01L 25/18; H01L 25/50; H01L 2225/06541; H01L 23/3107; H01L 23/3114; H01L 23/3121; H10B 80/00; H10B 41/35; H10B 43/35

USPC .......................................................... 257/668

See application file for complete search history.

(56) References Cited

U.S. PATENT DOCUMENTS

2015/0279825 A1* 10/2015 Kang ...................... H01L 25/50 438/109

2021/0327778 A1* 10/2021 Yu ......................... H01L 21/486

* cited by examiner

PACKAGE STRUCTURES, FABRICATING METHODS THEREOF, AND MEMORY SYSTEMS

CROSS-REFERENCE TO RELATED APPLICATION

This application claims priority to and the benefit of Chinese Patent Application 202310640168.8, filed on May 31, 2023, which is hereby incorporated by reference in its entirety.

TECHNICAL FIELD

Implementations of the present disclosure relate to the field of semiconductor technology, and in particular to package structures, fabricating methods thereof, and memory systems.

BACKGROUND

Die packaging is an important method in the fabricating process of a semiconductor device. Die packaging process refers to the method of encapsulating one or more dies cut from a wafer into a support housing for preventing physical damages, corrosions etc., thereby avoiding a contact between the die and external environment and preventing die damages and failures.

With the increasing demands for functionalities of integrated circuits, the integration level becomes higher and higher, various functional devices are integrated in a die, imposing higher and higher requirements on a packaging process while improving functions of the die. In some application scenarios of a package structure, the package structure may be pressed to different extents, so the package structure needs to have a certain mechanical strength to avoid deformation and failure of a die therein. Typically, the thickness of external packaging material of a die is increased to obtain a greater packaging strength such that the package structure can withstand greater bending stress.

DETAILED DESCRIPTION

Figure 1A:
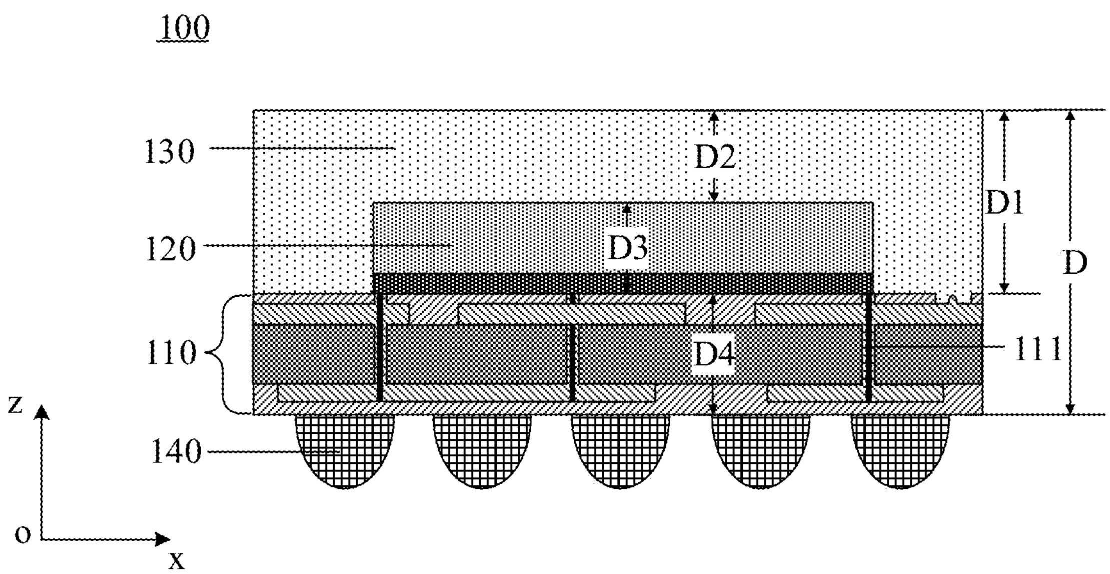
FIG. 1A is a schematic diagram illustrating a package structure according to an implementation of the present disclosure.

The technical aspects of the present disclosure will be further described in detail below with reference to the accompanying drawings and example implementations.

In implementations of the present disclosure, terms "first", "second", or the like are used to distinguish similar objects and are not intended to indicate any particular sequence or precedence.

In implementations of the present disclosure, the term "A contacts B" encompasses a case in which A contacts B directly or a case in which A contacts B indirectly, with other components inserted therebetween.

In implementations of the present disclosure, the term "layer" refers to a material portion including a region with a thickness. A layer may extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer may be located between any pair of horizontal planes at, or between, a top surface and a bottom surface of a continuous structure. A layer can extend horizontally, vertically, and/or along a tapered surface. Furthermore, a layer may include multiple sub layers.

It should be understood that the meaning of terms "on," "over," and "above" in the present disclosure should be interpreted in the broadest manner such that "on" not only means "on" something without any intermediate feature or layer (i.e., directly on something) but also includes the meaning of "on" something with an intermediate feature or a layer therebetween.

It is to be noted that, although implementations are described in the specification, not every implementation includes an independent technical solution and description of the implementations in the specification is provided only for clarity; the specification should be taken as a whole by those skilled in the art; and the technical solutions in the implementations can be used in any suitable combinations to form other implementations that can be understood by those skilled in the art.

There will be an upper limit for the total thickness of a package structure due to the limits of prior packaging protocols and more compact use space. Accordingly, how to improve the packaging strength of the package structure has become a problem that urgently needs to be solved.

In an example, a packaging process may include: providing a semiconductor device with an electrical function, placing the semiconductor device on a packaging substrate, encapsulating the semiconductor device with a packaging material in which semiconductor dies may be coupled via the packaging substrate, and disposing a conductive ball on a surface of the packaging substrate at a side without the semiconductor device be disposed to form a package structure; wherein the conductive ball may lead out an electrical signal from the packaging substrate for achieving an electrical signal interconnection between the semiconductor device and an external integrated circuit. The semiconductor device in the package structure may include one or more semiconductor dies. A semiconductor die may be formed by cutting a completed wafer along a predetermined cutting lane or cutting line.

FIG. 1A is a schematic diagram illustrating a package structure 100 according to an implementation of the present disclosure. Referring to FIG. 1A, the package structure 100 includes: a packaging substrate 110 having a first surface and a second surface opposite the first surface; a semiconductor device 120 on the first surface of the packaging substrate 110 and coupled with the packaging substrate 110; a cap layer 130 covering the first surface and encapsulating the semiconductor device 120; wherein the cap layer 130 and the packaging substrate 110 have a total thickness (D) in a first direction (z direction) perpendicular to the first surface; and a ratio between a distance (D2) from an upper surface of the cap layer 130 to an upper surface of the semiconductor device 120 in the z direction and the total thickness (D) satisfies a first preset value. The upper surface of the cap layer 130 in the present implementation is a surface at a side away from the packaging substrate 110 in the z direction, and the upper surface of the semiconductor device 120 is a surface at a side away from the packaging substrate 110 in the z direction.

Referring to FIG. 1A, in the z direction, the packaging substrate 110 may have a first surface and a second surface opposite the first surface, the first surface may be an upper surface in the positive z direction, and the second surface may be a lower surface in the negative z direction. Illustratively, the packaging substrate 110 may provide a mechanical support for the semiconductor device 120 and may also provide a power supply structure for the semiconductor device 120. Illustratively, the packaging substrate 110 may include a semiconductor material such as silicon substrate, germanium substrate, or the like, and may further include an organic resin, glass, a ceramic material, or the like. The first direction may be the z direction in the drawing, and the second direction may be the x direction in the drawing.

In some implementations, the package structure 100 further includes a conductive ball 140 that may penetrate through the package substrate 110. In the z direction, the semiconductor device 120 may have a first face and a second face opposite the first face, wherein the first face may be an upper surface in the positive z direction, and the second face may be a lower surface in the negative z direction. A plurality of conductive contacts (such as the second conductive contacts 1232 shown in FIG. 1B, as described later) are disposed on the second face of the semiconductor device 120. The conductive ball 140 is coupled with the conductive contact after penetrating through the packaging substrate 110. The conductive ball 140 may be configured as a welding spot to be fixed and coupled with an external integrated circuit to lead out an electrical signal of the semiconductor device 120 for achieving an electrical signal interconnection with the external integrated circuit. The conductive ball 140 may also function to dissipate heat from the semiconductor device 120. At this time, no conductive structure may be disposed on the two surfaces of the packaging substrate 110 and inside the packaging substrate 110, and the packaging substrate 110 only provides support for the semiconductor device 120. The first surface of the packaging substrate 110 may be provided with a groove with its opening facing the first surface, namely facing the z direction. The groove may provide an accommodating space for the semiconductor device 120 to facilitate fixing the semiconductor device 120 and providing better protection.

FIG. 1A shows the semiconductor device 120 including one semiconductor die, but this is merely an example. The semiconductor device 120 may also include a plurality of semiconductor dies stacked in the z direction or include a plurality of semiconductor dies disposed horizontally in x direction. The arrangement and type of the semiconductor dies may be selected according to different packaging demands and packaging protocols, which is not limited in implementations of the present disclosure. When the semiconductor device 120 includes a plurality of semiconductor dies stacked in the z direction, the above-described first face refers to the upper surface of the topmost semiconductor die, and the above-described second face refers to the lower surface of the bottom most semiconductor die. Illustratively, the semiconductor die may include one or more of the following dies: a radio frequency (RF) die, a positioning (GPS) die, a memory (DRAM) die, a memory (NAND) die, a Bluetooth die, and a controller die.

In some implementations, the package structure 100 further includes a power supply network that may include a redistribution layer or other conductive structures. The power supply network may be a part of the packaging substrate 110 and located on the upper surface of the packaging substrate 110. Alternatively, the power supply network has a part located on the upper surface of the packaging substrate 110, a part located inside the packaging substrate 110, and a part located on the lower surface of the packaging substrate 110. These three parts of the power supply network may be coupled via a conductive channel (the third conductive channel 111 as shown in FIG. 1A) that penetrates through the packaging substrate 110. In an example, the power supply network may include a wiring layer, a conductive channel (conductive plug), a conductive contact, a pad or other conductive structures. The power supply network may be a part of the packaging substrate 110.

Figure 1B:
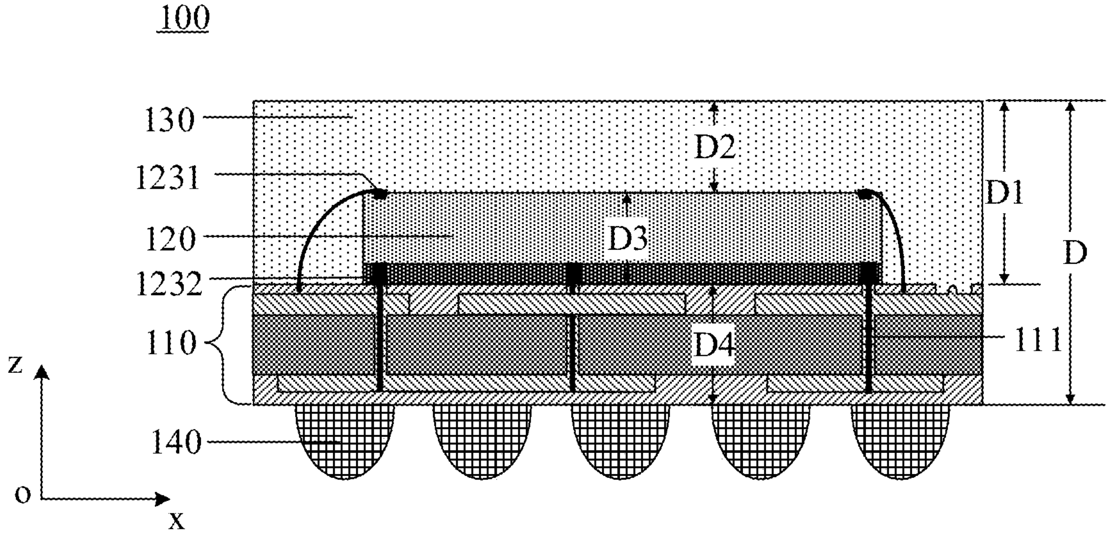
FIG. 1B is a schematic diagram illustrating a package structure according to an implementation of the present disclosure.

In some implementations, FIG. 1B shows a schematic diagram of another package structure 100. Referring to FIG. 1B, a plurality of first conductive contacts 1231 are disposed on the upper surface of the semiconductor device 120 and coupled with the packaging substrate 110 via leads, in particular coupled with the power supply network on the packaging substrate 110.

In some implementations, referring to FIG. 1B, a plurality of second conductive contacts 1232 are disposed on the lower surface of the semiconductor device 120, may serve as bonding pads, and may be bonded with pads on the packaging substrate 110 for achieving coupling and fixing. In some other implementations, solder balls may be disposed between the semiconductor device 120 and the packaging substrate 110, and the second conductive contacts 1232 of the semiconductor device 120 and the power supply network on the packaging substrate 110 are coupled and fixed via the solder balls. It is noted that the coupling modes for the semiconductor device 120 and the packaging substrate 110 in the above-described implementation may be provided separately or in combinations. For example, the lower surface of the semiconductor device 120 is only coupled with the upper surface of the packaging substrate 110. As another example, after the second conductive contacts 1232 on the lower surface of the semiconductor device 120 are coupled with the upper surface of the packaging substrate 110, leads are further provided to couple the first conductive contacts 1231 on the upper surface of the semiconductor device 120 and the upper surface of the packaging substrate 110.

Illustratively, the conductive contacts, the solder balls and the power supply network may include, but not limited to, a conductive material such as copper, gold, silver, platinum, aluminum, tungsten, chromium, nickel, titanium, tin, or the like.

In some implementations, a cap layer 130 is located on the upper surface of the packaging substrate 110, encapsulating the semiconductor device 120 and at the same time covering at least partial upper surface of the packaging substrate 110. It is noted that since the lower surface of the semiconductor device 120 is disposed on the upper surface of the packaging substrate 110, and the lower surface of the semiconductor device 120 coincides with the upper surface of the packaging substrate 110 in the z direction, the lower surface of the semiconductor device 120 does not contact the cap layer 130, the upper surface and side faces of the semiconductor device 120 are covered by the cap layer 130, and the cap layer 130 may contact the upper surface and side faces of the semiconductor device 120.

Referring to FIG. 1A, the cap layer 130 may include a single layer of packaging material that may include any known materials in the art. When the cap layer 130 is a single layer of material, the cap layer 130 comprises an insulation material, including, but not limited to silicon oxide, silicon nitride, silicon oxynitride or resin. The cap layer 130 may provide protection and mechanical support for the semiconductor device 120, reduce damages such as chemical corrosions, mechanical pressing, vibrations, or the like during the use of the package structure 100, and improve the reliability of the package structure 100. The cap layer 130 may include a thermally conductive material such as an organosilicon thermally conductive material.

Figure 1C:
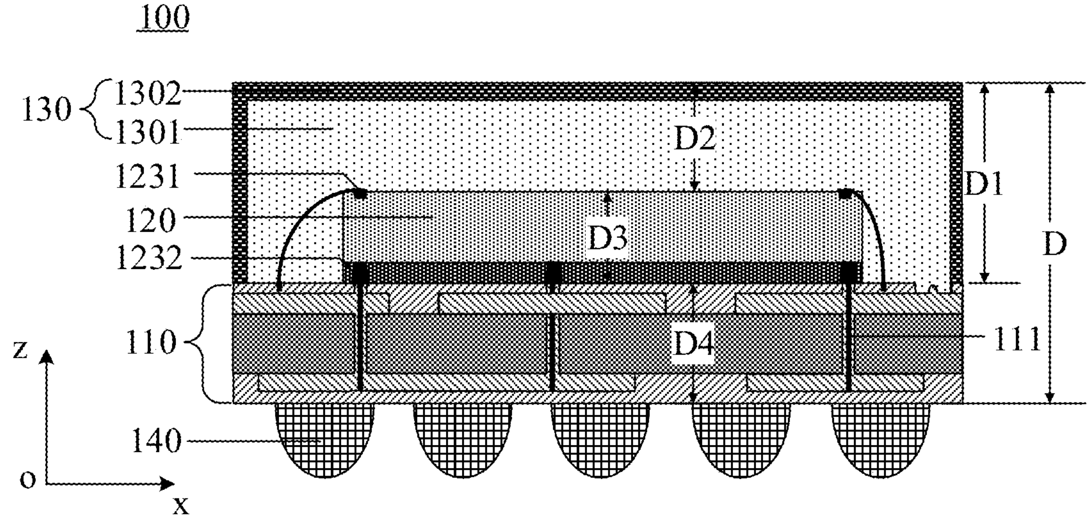
FIG. 1C is a schematic diagram illustrating a package structure according to an implementation of the present disclosure.

In some implementations, referring to FIG. 1C, the cap layer 130 includes an insulating layer 1301 and a conductive layer 1302, wherein the conductive layer 1302 encapsulates the insulating layer 1301 and may be coupled with the ground line in the power supply network.

In some implementations, the cap layer 130 may include a single layer of packaging material or multiple layers of packaging materials, and when the cap layer 130 is a single layer of packaging material, the cap layer 130 comprises an insulation material. The cap layer 130 may include an insulating layer 1301 and a conductive layer 1302 that encapsulates the insulating layer 1301. The insulating layer 1301 is between the conductive layer 1302 and the semiconductor device 120 and may directly contact the upper surface and side faces of the semiconductor device 120. The insulating layer 1301 may include an insulating material. The conductive layer 1302 may include a conductive material including, but not limited to copper, gold, silver, platinum, aluminum, tungsten, chromium, nickel, titanium, tin, or the like. The conductive layer 1302 may be a continuous film structure or a grid structure. The insulating layer 1301 provides mechanical support and protection for the semiconductor device 120. The conductive layer 1302 may form a Faraday ring (or quasi-Faraday ring) around the semiconductor device 120, reducing an ambient electromagnetic interference with the semiconductor device 120 and improving the operation stability of the semiconductor device 120. The conductive layer 1302 may be coupled with the ground terminal on the packaging substrate 110 to release free charges on the conducting layer 1302 through the ground terminal, reducing electrostatic damage and improving stability. In some other implementations, the cap layer 130 further includes a protection layer located on the upper most layer of the cap layer 130 and encapsulating the conductive layer 1302 for protecting the conductive layer 1302 and reducing oxidation of the conductive layer 1302. The insulating layer 1301 is the thickest part in the cap layer 130. The conductive layer 1302 and the protection layer may have the same thickness that is much smaller than the thickness of the insulating layer 1301.

In some examples, the total thickness of the cap layer 130 may comprise 500 microns to 750 microns, the thickness of the insulating layer 1301 may comprise 499 microns to 899 microns, and the thickness of each of the conductive layer 1302 and the protection layer may comprise 1 micron to 10 microns. Data in this implementation is only an example. When the insulating layer 1301 has a relatively larger thickness to provide mechanical support and protection for the semiconductor device 120 and the conductive layer 1302 encapsulates the insulating layer 1301, the insulating layer 1301 and the conductive layer 1302 may have greater or smaller thicknesses, which are not limited in implementations of the present disclosure. When performing a 3-point bending test, as compared to the thicker insulating layer 1301, the effect of the conductive layer 1302 and the protection layer on pressure strain is smaller or negligible.

In some implementations, in addition to the electromagnetic shield and electrostatic discharge, the conductive layer 1302 in the cap layer 130 may be configured to conduct heat to reduce the operation temperature of the semiconductor device 120. The insulating layer 1301 and the protection layer may also include a thermally conductive material for heat conduction and cooling.

In some implementations, during the use of the package structure 100, the package structure 100 may be pressed by an external force, or may resonate due to an external vibration, in particular when used in a mobile device in which the use conditions are more complex. In addition to the excellent electrical performance, the package structure 100 has excellent mechanical performance, which facilitates keeping good stability of the semiconductor device 120 and also improving the useful life. Illustratively, the package structure 100 in the present implementation is applicable to a mobile device. The package structure 100 includes, but not limited to a product implementing a HBM protocol, a product implementing a HMC protocol, a product implementing a Chiplet protocol, a product implementing a UFS protocol, a product implementing an EMMC protocol, and a product implementing other protocols.

The mechanical performance test may include a bending test, a tensile test, etc. Since the package structure 100 is less likely to be stretched while used in an integrated circuit board (PCB) but is more likely to suffer from a pressure and twisting force. In an example implementation of the present disclosure, the package structure 100 undergoes a pressure test to characterize the bending deformation degree of the package structure 100 when suffering from an external stress. Relevant national industry standards or enterprise internal standards may be referred to for testing conditions and testing methods, which are not limited in implementations of the present disclosure.

Figure 2:
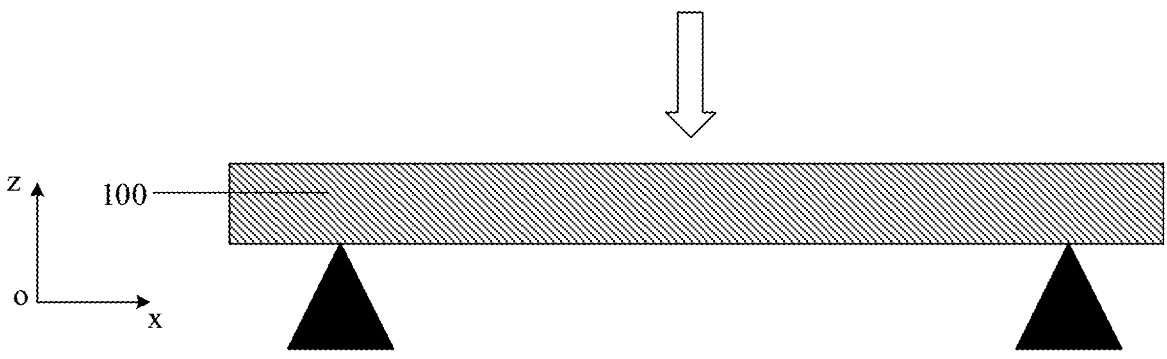
FIG. 2 is a schematic diagram illustrating a 3-point bending test of a package structure according to an implementation of the present disclosure.

Referring to FIG. 2, the package structure 100 undergoes a 3-point bending test in the implementations of the present disclosure. The test table may include automatic or semi-automatic versatile stretching and pressing test table. The package structure 100 (the package structure 100 may not include the conductive ball 140) is prepared as a sample according to a test standard, and the test sample is placed on a carrier table with a two-point support, wherein the carrier table includes two support points. An un-supported part of the bottom of the test sample is suspended. A squeeze head that may displace up and down is over the test sample and may apply pressure on the test sample when the squeeze head displaces down. The test table has a squeeze head displacement monitoring device for acquiring displacement data of the squeeze head and a force acquisition device for acquiring a real-time stress of the squeeze head including a pressure and a tensile force.

In some implementations, after testing the package structure 100, test data is processed and analyzed. It is possible to establish a graph of the pressure stress of the test sample vs the head displacement and to establish a graph of the strain of the test sample vs the time.

Figure 3A:
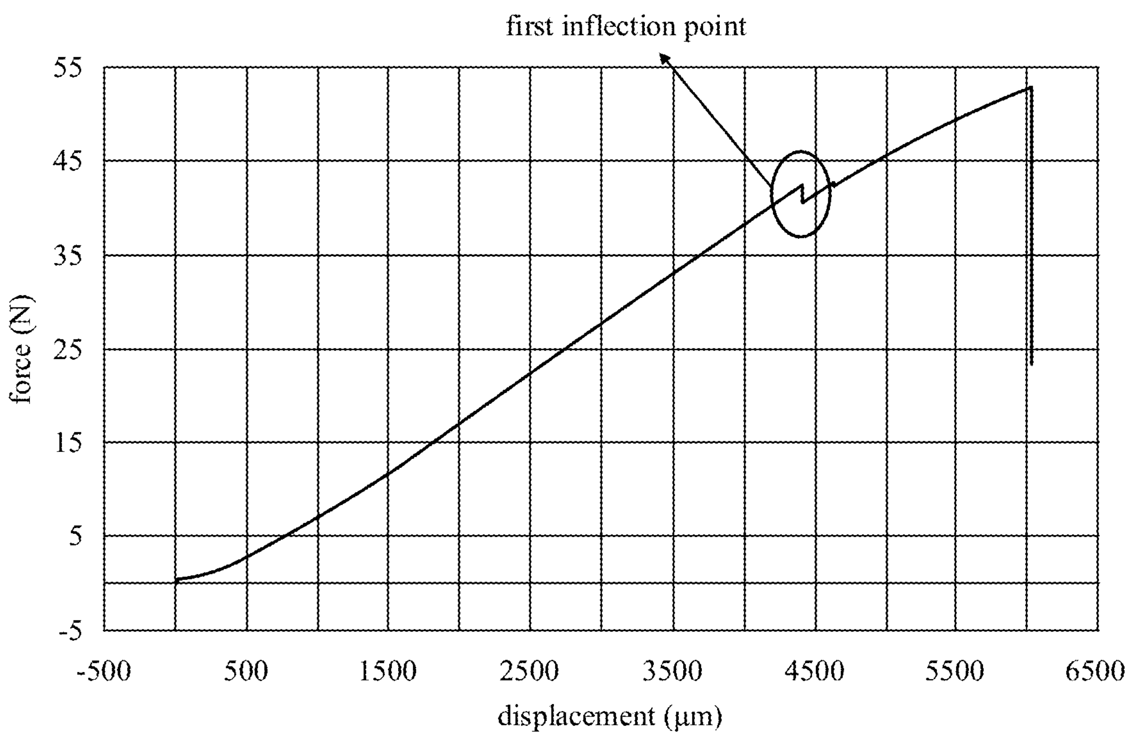
FIG. 3A is a pressure-displacement graph illustrating a 3-point bending test of a package structure according to an implementation of the present disclosure.

Referring to FIG. 3A, while the squeeze head continuously displaces down to press the package structure 100, the package structure 100 suffers from an increasingly larger pressure stress due to its elastic resistance with the squeeze head continuously pressing downward until a first inflection point, namely the first inflection point highlighted with a circle in FIG. 3A, which indicates that the package structure 100 has reached its elastic yielding, i.e., the largest deformation strength it can withstand, and the applied larger pressure would destroy the material structure such that it can't be restored. In other words, if the pressure stress is removed before the first inflection point, the deformation of the package structure 100 may be restored. The displacement in the graph may characterize the bending degree of the package structure 100 in the applied direction of the vertical pressure.

In some examples, after the first inflection point, the pressure stress increases continuously, which is the force condition after the material has gone through the elastic yielding. The material performance has deteriorated, and the anti-bending mechanical performance of the package structure 100 has failed, which may cause failure of the semiconductor device 120 inside the package structure 100 due to the bending. Therefore, the force graph after the first inflection point is out of the research scope of the present implementation. In some other examples, the test graph has a plurality of inflection points since the package structure 100 has multiple layers of materials and a gap occurs between materials that are originally bonded closely after a force is applied, thereby leading to a plurality of inflection points and a plurality of sections of force graphs. Implementations of the present disclosure place more focus on the force graph when the package structure 100 has a relatively complete topology, i.e., a section of the graph before the first inflection point.

Figure 3B:
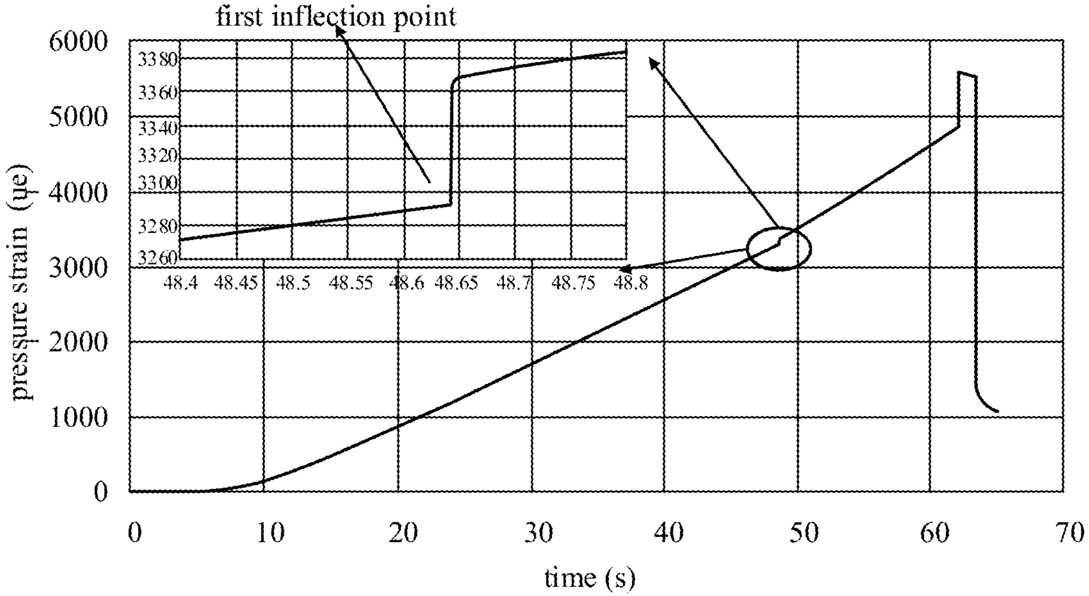
FIG. 3B is a pressure strain-time graph illustrating a 3-point bending test of a package structure according to an implementation of the present disclosure.

Referring to FIG. 3B, a graph of a strain of the package structure 100 vs the time is shown. Unlike the displacement, the strain may be a ratio in some test standards that characterizes the ratio of the deformation amount to the original size after subjecting to the pressure stress. $\varepsilon=\Delta L/L$, wherein $\varepsilon$ denotes the strain, ue denotes a micro-strain in unit of 10-6, $\Delta L$ denotes the deformation amount, and L denotes the original amount. The strain reflects the deformation strength generated by the package structure 100 upon experiencing external stress. The maximum deformation strength generated by the package structure 100 is tested by applying a certain bending stress to the package structure 100 while guaranteeing that the package structure 100 will not fail in functions.

It is noted that the $\Delta L$ in the implementations of the present disclosure may indicate deformation amounts in two dimensions, such as the deformation in the vertical force direction or the elongation amount of the entire package structure 100 after bent. In FIG. 3B of the implementation of the present disclosure, the overall elongation amount of the package structure 100 after bent by a pressure is adopted as the stain, and the strain corresponding to the first inflection point is the maximum deformation degree the package structure can withstand. In an implementation of the present disclosure shown in FIG. 3B, the maximum strain of the package structure 100 is between 3280 ue to 3360 ue.

Figure 4:
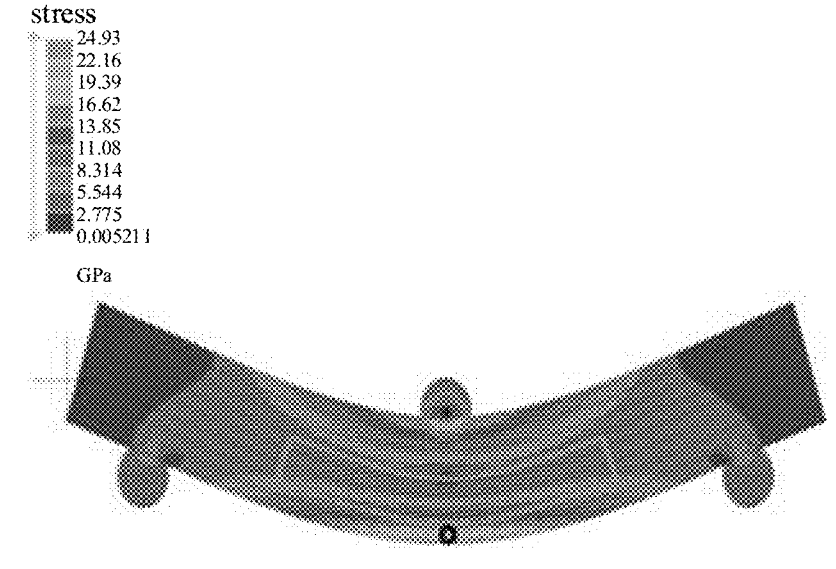
FIG. 4 is a schematic diagram illustrating a bending deformation of 3-point bending test of a package structure according to an implementation of the present disclosure.

As also shown in FIG. 4, FIG. 4 shows a stress distribution diagram (in unit of Gpa) of regions of a package structure 100 when the package structure 100 experiences a bending deformation after subjecting to a pressure. The bending deformation of the middle region is maximum, and the stress is the maximum too. In some implementations, it is possible to use electrical resistance strain measuring technology to test the strain of the package structure 100. In an example, a resistance strain sheet is adhered and fixed to a side surface of the package structure 100. The side surface may be the back surface without contacting the squeeze head. The resistance strain sheet has a connection terminal and is coupled with the connection terminal and connected with an external circuit (a resistance strain gauge) with leads. While the package structure 100 is bent and deformed by a pressure, the resistance strain sheet deforms with it too, and the resistance length in the resistance strain sheet will increase. The length change amount (i.e., the stain) is converted into the resistance change and then converted into the measured strain through transformation and amplification by the external circuit.

It is understood that when the test sample is of a single material, while enforcing the same test standard, the thicker the sample is, the stronger its anti-bending capability is, and the larger the strain is before the material reaches the elastic yielding. In view of this, in connection with the package structure 100 shown in FIGS. 1A to 1C of implementations of the present disclosure, it is possible to increase thicknesses of the semiconductor device 120, the cap layer 130 and the packaging substrate 110 to increase the maximum strain of the package structure before failure. The package structure 100 needs to satisfy an integrated circuit with increasingly higher integration intensity, and needs to adapt to packaging protocols or standards. Therefore, the size of the package structure 100, particularly the thickness would be limited. In implementations of the present disclosure, it is found by multiple test implementations that it is possible to increase the maximum strain of the package structure 100 before failure by increasing the ratio between the distance from the upper surface of the cap layer 130 to the upper surface of the semiconductor device 120 and the total thickness of the package structure 100, such that the anti-bending capability of the package structure 100 may be enhanced without increasing the total thickness of the package structure 100. On the other hand, in implementations of the present disclosure, it is possible not to increase the thickness of the packaging substrate 110, which facilitates the adaptation to existing packaging substrate 110 and reducing packaging costs.

Figure 5:
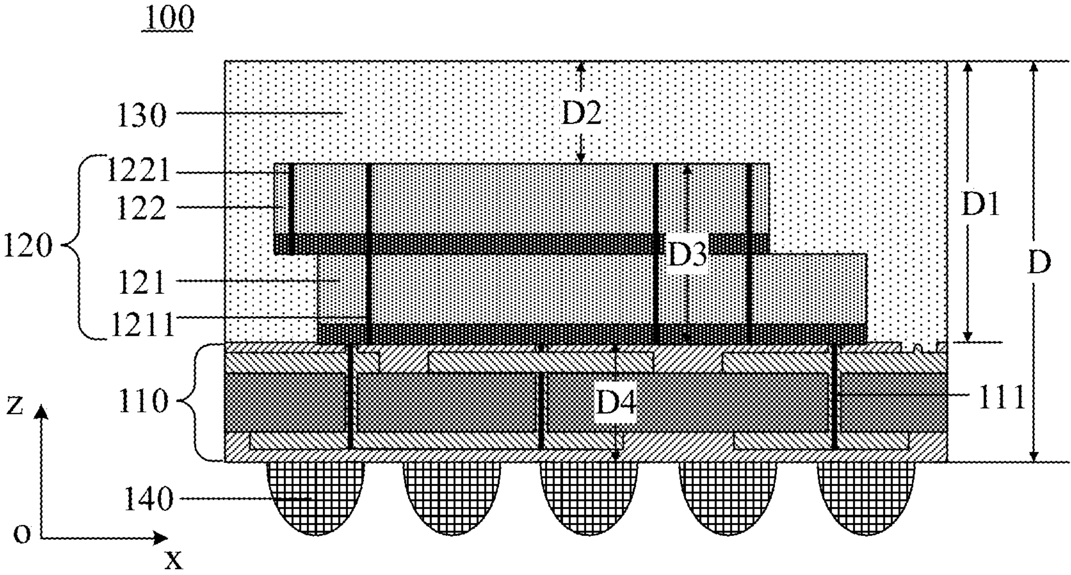
FIG. 5 is a schematic diagram illustrating a package structure according to an implementation of the present disclosure.

Referring to FIGS. 1A to 1C, in the z direction, the cap layer 130 has a thickness D1 that is the distance from the upper surface of the cap layer 130 to the upper surface of the packaging substrate 110. Here, it is considered that the cap layer 130 may cover the packaging substrate 110 well and there is not a gap or void between the cap layer 130 and the packaging substrate 110 or the error caused by the gap and void is negligible. Some packaging substrates 110 would be provided with a power supply network or a connection terminal (a ground terminal) such that the packaging substrate 110 has an upper surface with concave and convex parts. Here, the connection terminal is of a relatively smaller size, so the effect of connection terminal on the thickness D1 of the cap layer 130 may be neglected, in which the thickness D1 of the cap layer 130 may be the average thickness. The distance (thickness) from the upper surface of the cap layer 130 to the upper surface of the semiconductor device 120 is D2, the thickness of the semiconductor device 120 is D3, the thickness of the packaging substrate 110 is D4, the total thickness of the cap layer 130 and the packaging substrate 110 is D, and the above-described thicknesses may be average thicknesses obtained by measuring the films at multiple points. D=D2+D3+D4, η=D2/D=D2/(D2+D3+D4). It is noted that when it is considered that there is not a gap between the cap layer 130 and the packaging substrate 110 or the gap is neglected, the distance from the upper surface of the cap layer 130 to the upper surface of the semiconductor device 120 may be the thickness difference between the cap layer 130 and the semiconductor device 120, namely D2=D1−D3. In some implementations, the semiconductor device 120 may include a plurality of semiconductor dies. The semiconductor device 120 as shown in FIG. 5 includes two semiconductor dies. D2 is the distance from the upper surface of the cap layer 130 to the upper surface of the topmost semiconductor die. Corresponding thickness indicia are shown in FIG. 5, and the thickness of the packaging substrate 110 in FIG. 5 is the same as the thicknesses of the packaging substrates 110 in FIGS. 1A to 1C.

Figure 6A:
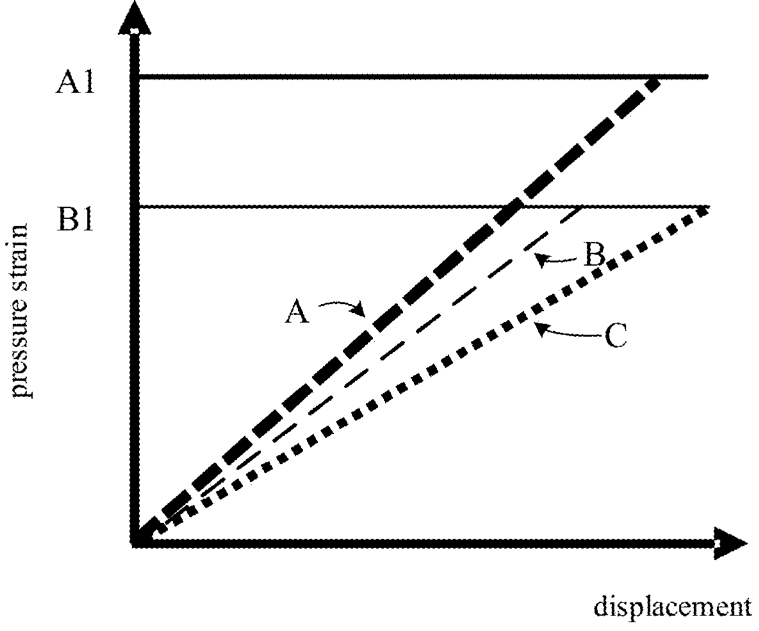
FIG. 6A is a pressure strain-displacement graph illustrating a 3-point bending test of various package components of a package structure according to an implementation of the present disclosure.

Referring to FIG. 6A, for an example implementation of the present disclosure, a test graph A of the pressure strain of the cap layer 130 in the package structure 100 vs the head displacement, a test graph B of the pressure strain of the semiconductor device 120 vs the head displacement, and a test graph C of the pressure strain of the package structure 100 having the cap layer 130 and the semiconductor device 120 vs the head displacement are shown. FIG. 6A further illustrates the maximum pressure strain A1 before the failure of the cap layer 130 and the maximum pressure strain B1 before the failure of the semiconductor device 120. As can be seen from FIG. 6A, the slopes of graphs A, B and C decrease in turn, and the displacement of the semiconductor device 120 to reach the maximum pressure strain is smaller than that of the cap layer 130 to reach the maximum pressure strain, which indicates that the semiconductor device 120 has an anti-elastic deformation strength smaller than that of the cap layer 130 and the cap layer 130 undergoes a greater plastic deformation than the deformation capability of the semiconductor material in the semiconductor device 120. The cap layer 130 has a stronger anti-deformation capability such that the anti-elastic deformation strength of the semiconductor device 120 after being covered by the cap layer 130 is significantly improved as compared to the pure semiconductor device 120. In implementation of the present disclosure, it is possible to enhance the overall anti-elastic deformation strength of the package structure 100 and improve stability by increasing the thickness of the cap layer 130. Due to the limitation of the total thickness of the package structure 100, increasing only the thickness of the cap layer 130 would result in a too large total thickness of the package. In view of this, in implementations of the present disclosure, it is proposed to increase a proportion of the thickness of the cap layer 130 in the thickness of the entire package structure 100, which may be realized by on one hand increasing the thickness of the cap layer 130 properly, and on the other hand thinning the semiconductor device 120.

In some implementations, the thickness D4 of the packaging substrate 110 is kept constant, and the thickness D3 of the semiconductor device 120 or the thickness D1 of the cap layer 130 is changed to change the value of namely changing the ratio between the distance from the upper surface of the cap layer 130 to the upper surface of the semiconductor device 120 and the total thickness of the package structure, wherein η=D2/(D2+D3+D4). The package structures 100 with different η values are subjected to pressure tests and it is found that there is a monotonous relationship between the pressure strain and the η value, which may be a fitted linear relationship. A first preset value is defined to correspond to the η value, and a second preset value is defined to correspond to the pressure strain. There is a monotonous relationship between the second preset value and the first preset value. The second preset value is selected according to the use conditions of the package structure 100 and design requirements for the package structure 100. The first preset value is determined according to the monotonous relationship between the first preset value and the second preset value. The value of D3 or D1 is adjusted according to the first preset value such that the package structure 100 has a larger pressure strain, thereby improving the anti-bending capability of the package structure 100 and improving the stability.

In some implementations, the pressure strain of the package structure 100 satisfies the second preset value.

In some implementations, there is a monotonous relationship between the pressure strain and the ratio η, and the first preset value and the second preset value are determined according to the monotonous relationship.

Figure 6B:
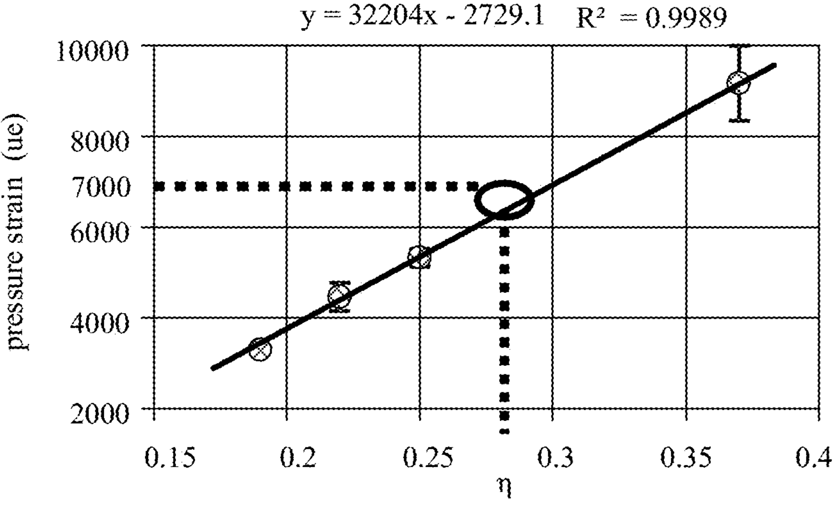
FIG. 6B is a pressure strain graph illustrating a 3-point bending test of a package structure with a different η value according to an implementation of the present disclosure.

Referring to FIG. 6B, a 3-point bending test is performed on package structures 100 with different η values, and a linear fitting analysis is performed on the test data with the abscissa being a η value, the ordinate being a pressure strain in unit of ue, and a fitted correlation coefficient being 0.9989. According to the linear relationship, the pressure strains corresponding to different η values are predictable, and it is possible to determine the η value according to the pressure strain value or determine the pressure strain according to the η value. In FIG. 6B, the shown η values are in the range of 0.18 to 0.37, the pressure strains are in the range of 3000 ue to 9000 ue, which are only examples and other values may be predicted or experimentally verified according to the linear relationship in the present implementation. The test samples in the present implementation may be prepared with the package structures 100 shown in FIGS. 1A to 1C or FIG. 5 according to relevant test standard, and the package structures 100 may not include the conductive balls.

In some implementations, the first preset value is in the range of 0.22 to 0.45, and the second preset value is greater than 7000 ue.

The first preset value and the second preset value may be selected according to design requirements or packaging protocols. For example, the second preset values for an example UFS3.1 package structure 100 and an example UFS2.2 package structure 100 need to be greater than 4200 ue. According to FIG. 6B, it is possible to adjust η to 0.25. Alternatively, the second preset value for some package products needs to be greater than 7000 ue, and the η value is greater than 0.3. Accordingly, the thickness of the semiconductor device 120 may be greater than 35 microns but smaller than 160 microns.

In some implementations, it is possible to measure the thickness of the cap layer 130, the semiconductor device 120 or the packaging substrate 110 with an optical measuring table. Here, it may be considered that the packaging substrate 110 may be a general purpose product with a known thickness. The thickness of the semiconductor device 120 or the thickness of the cap layer 130 is adjusted to enable η to satisfy the first preset value. For example, the thickness of the semiconductor device 120 is measured before packaging the semiconductor device 120 and is adjusted by thinning a substrate of the semiconductor device 120. The thickness of the cap layer 130 is then obtained by also considering the thickness of the packaging substrate 110 and the first preset value and may be in a range of values. The thickness of the cap layer 130 is measured after forming the cap layer 130. If the thickness is too large, the cap layer 130 is thinned by a cutting or grinding process. If the thickness is too small, the cap layer 130 is thickened or the cap layer 130 is removed and re-formed.

In some implementations, in the z direction, the thickness D3 of the semiconductor device 120 is greater than 35 microns; the thickness D4 of the packaging substrate 110 comprises 90 microns to 180 microns; the total thickness D of the cap layer 130 and the packaging substrate 110 comprises 500 microns to 750 microns; and without considering η value or the thickness of the semiconductor device 120, the thickness of the cap layer 130 comprises 320 microns to 660 microns. The above-described value ranges are only examples, and implementations of the present disclosure are not limited thereto.

The total thickness of the package structure 100 without a conductive ball 140 comprises 500 microns to 750 microns; and the total thickness of the package structure with the conductive ball 140 comprises 800 microns to 1000 microns. The package structure 100 for bending test may include the conductive ball 140 or may not include the conductive ball 140. The thickness of the conductive ball 140 accounts for a smaller proportion with respect to the total thickness of the package structure 100. The conductive ball 140 focuses more on the conduction performance and has a negligible effect on the pressure test result.

The above-described thicknesses may be measured with an optical measuring table. The thickness value may be an average value of measurement values of multiple points or regions of a film so as to reduce the film thickness measurement error caused by the uneven surface of the film. The multiple points may include 49 points, 99 points or even more.

The thickness of the cap layer 130 and the semiconductor device 120 in implementations of the present disclosure may be adjustable values. In case that the thickness of the semiconductor device 120, η value and the total thickness of the package structure 100 are determined, the thickness of the cap layer 130 may also be determined. In an example in which the semiconductor device 120 has a thickness D3 of 100 microns, the η value comprises 0.22 to 0.45 and the thickness D4 of the packaging substrate 110 is 100 microns, the thickness D1 of the cap layer is calculated according to the formula $D1=(\eta D4+D3)/(1-\eta)$ as 156 microns to 809 microns, and accordingly the total thickness D of the cap layer 130 and the packaging substrate 110 comprises 256 microns to 909 microns, and the total thickness D of the cap layer 130 and the packaging substrate 110 is limited to 500 microns to 750 microns in some packaging protocols. Thus, the selectable range of the cap layer 130 comprises 400 microns to 650 microns in which η value is adjusted to be 0.22 to 0.45, or higher in some implementations to obtain a higher anti-bending strength. It is noted that data in implementations of the present disclosure is only an example, and specific thicknesses of components may be determined according to the thickness relationship shown in FIGS. 1A and 5 of implementations of the present disclosure and η value. In some other implementations, η value may be 0.3, the total thickness is 500 microns, the thickness of the semiconductor device 120 is 160 microns, the thickness of the cap layer 130 is 310 microns, and the thickness of the packaging substrate 110 is 190 microns.

In some implementations, referring to FIG. 5, the semiconductor device 120 includes a plurality of semiconductor dies coupled with each other.

In some implementations, referring to FIG. 5, the semiconductor device 120 includes: a first semiconductor die 121 including a first bonding layer having a plurality of first bonding contacts; and a second semiconductor die 122 including a second bonding layer having a plurality of second bonding contacts; wherein the first bonding layer is bonded with the second bonding layer, and the first semiconductor die 121 is coupled with the second semiconductor die 122 through the first bonding contacts and the second bonding contacts.

Referring to FIG. 5, two semiconductor dies are considered as an example. The number and type of the semiconductor dies are not limited in implementations of the present disclosure. For example, 3, 4 and even 8 semiconductor dies or more semiconductor dies may be stacked. The first semiconductor die 121 is located between the second semiconductor die 122 and the packaging substrate 110, may be coupled with the packaging substrate 110 by a direct bonding, and may also be coupled with the packaging substrate 110 by a solder ball.

The first semiconductor die 121 and the second semiconductor die 122 may both be NAND flash dies. The first semiconductor die 121 may be a DRAM die, and the second semiconductor die 122 is a NAND flash die. The first semiconductor die 121 may be a logic die, and the second semiconductor die 122 may be a NAND flash die or a DRAM die. The package structure 100 may be a system on chip (SoC). The first bonding layer is located on the upper surface of the first semiconductor die 121. The second bonding layer is located on the lower surface of the second semiconductor die 122. The first bonding layer and the second bonding layer are bonded face to face and are coupled via the bonding contacts.

Upon bonding, a first wafer including a plurality of first semiconductor dies 121 may be bonded with a second wafer including a plurality of second semiconductor dies 122. The bonding may include a hybrid bonding. The bonding layer includes bonding contacts and an insulating dielectric layer. The two wafers are in electrical communication via the conductive bonding contacts, and the insulating dielectric layer provides an electrical isolation and a larger bonding surface for an improved bonding force. Electrical signals of the first semiconductor dies 121 and the second semiconductor dies 122 are led out to the bonding contacts for interconnection. The first semiconductor dies 121 are coupled with the packaging substrate 110 for powering the first semiconductor dies 121 and the second semiconductor dies 122. After completing the wafer bonding, the bonded wafers are cut to form semiconductor devices 120. In some other implementations, a lead may be provided to couple the contact on the upper surface of the second semiconductor die 122 with the packaging substrate 110 for powering the second semiconductor die 122.

The number and arrangement of semiconductor dies in the semiconductor device 120 are not limited in implementations of the present disclosure. In FIG. 5, the first semiconductor die 121 and the second semiconductor die 122 are stacked in a staggered manner to facilitate disposing a lead on the upper surface of the first semiconductor die 121 for coupling to the packaging substrate 110. In some implementations, the first semiconductor die 121 and the second semiconductor die 122 may have the same size in the x direction, that is, the two semiconductor dies may be disposed to completely overlap. In some implementations, a third semiconductor die may be further disposed on the packaging substrate 110 and may be juxtaposed with the first semiconductor die 121 in the x direction.

In some implementations, referring to FIG. 5, the package structure 100 further includes a first conductive channel 1211 penetrating through the first semiconductor die 121 and coupled with the first bonding contact.

In some implementations, referring to FIG. 5, the package structure 100 further includes a second conductive channel 1221 penetrating through the second semiconductor die 122 and coupled with the second bonding contact.

The first conductive channel 1211 and the second conductive channel 1221 are coupled via the bonding contacts. The conductive channels can not only implement power interconnection among the semiconductor dies, but also implement communication interconnection among the semiconductor dies. For example, when the first semiconductor die 121 is a logic die and the second semiconductor die 122 is a memory die, the first semiconductor die 121 transmits a control instruction to the second semiconductor die 122 via the conductive channels and bonding contacts for the communication interconnection.

In some implementations, the package structure 100 further includes a power supply network on the first surface and/or in the packaging substrate 110. The power supply network is coupled with the semiconductor device 120.

The power supply network may include a redistribution layer or other wiring structures. The power supply network may be a part of the packaging substrate 110 and located on the upper surface of the packaging substrate 110. Alternatively, the power supply network has a part located on the upper surface of the packaging substrate 110, a part located inside the packaging substrate 110, and a part located on the lower surface of the packaging substrate 110. These three parts of the power supply network may be coupled via a third conductive channel 111 that penetrates through the packaging substrate 110. In an example, the power supply network may include a wiring layer, a third conductive channel 111 (conductive plug), a conductive contact, a pad or other conductive structures. The power supply network is interconnected with an external integrated circuit and powers the semiconductor device 120.

In some implementations, as shown in FIGS. 1A to 1C and 5, the package structure 100 further includes a conductive ball 140 located on the second surface of the packaging substrate 110 and coupled with the semiconductor device 120. The conductive ball 140 may draw an electrical signal out of the packaging substrate 110 for achieving an electric signal interconnection between the semiconductor device 120 and the external integrated circuit, and may also be configured as a welding spot to fix the packaging substrate 100 and dissipate heat.

In some implementations, the conductive ball 140 may penetrate the packaging substrate 110 to be coupled with the semiconductor device 120 such that the power supply network on the packaging substrate 110 may be omitted.

According to some aspects of implementations of the present disclosure, there is provided a memory system including any one of the package structures 100 in the above implementations in which the semiconductor device 120 includes a memory controller and a memory device coupled therewith, and the memory controller is configured to control the memory device.

Figure 7:
FIG. 7 is a schematic diagram illustrating an example system having a memory system according to an implementation of the present disclosure.
Figure 7:
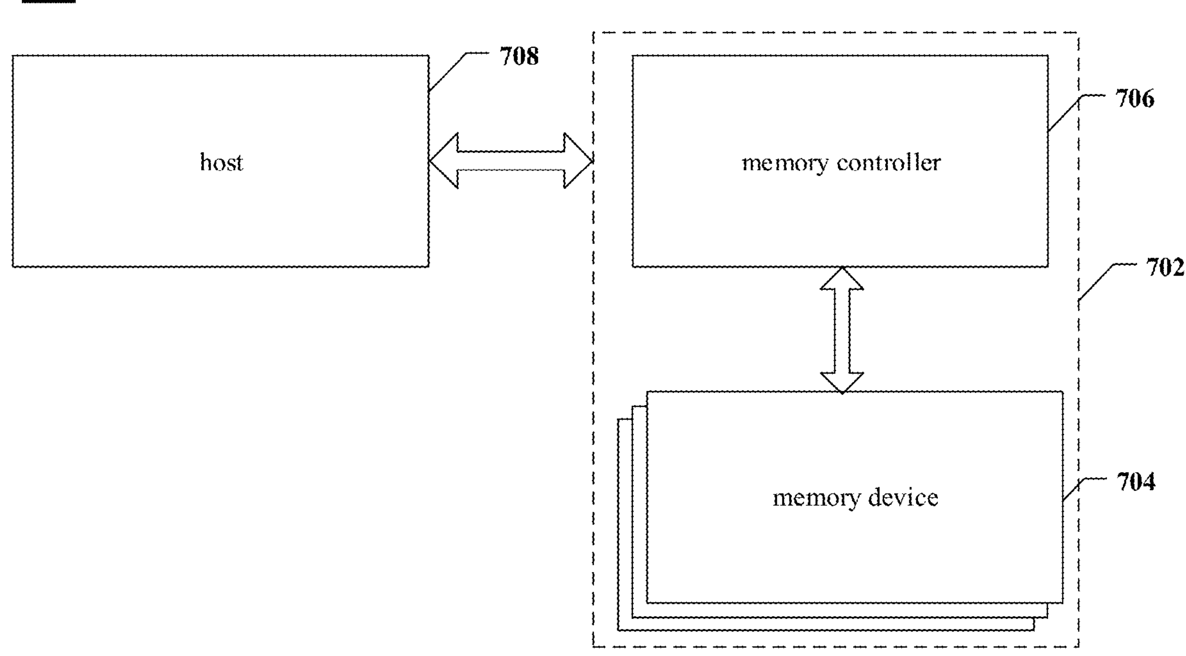

FIG. 7 illustrates a block diagram of an example system 700 having a memory device according to some aspects of the implementations of the present disclosure. The system 700 may be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having a memory therein. As shown in FIG. 7, the system 700 may include a host 708 and a memory system 702 having one or more memory devices 704 and a memory controller 706. The host 708 may be a processor of an electronic device, such as a central processing unit (CPU), or be a system-on-chip (SoC), such as an application processor (AP). The host 708 may be configured to send data to the memory device 704 or receive data from the memory device 704.

The memory device 704 may be any of the memories disclosed in the present disclosure. As disclosed in detail below, the memory device 704 (for example, a NAND flash memory such as a three-dimensional (3D) NAND flash memory) may have a reduced leak current from a driving transistor (such as a string driver) coupled to an unselected word line during an erase operation, which allows the driving transistor to be scaled down further.

According to some implementations, the memory controller 706 is coupled to the memory device 704 and the host 708 and is configured to control the memory device 704. The memory controller 706 may manage the data stored in the memory device 704 and communicate with the host 708.

In some implementations, the memory controller 706 is designed for operating in a low duty-cycle environment such as a secure digital (SD) card, a compact Flash (CF) card, a universal serial bus (USB) Flash drive, or another medium for use in electronic devices, such as personal computers, digital cameras, mobile phones, etc. In some implementations, the memory controller 706 is designed to operate in a high duty-cycle environment such as a SSD or an embedded multimedia card (eMMC) used as data storage for mobile devices such as smart phones, tablet computers, laptop computers, etc., and enterprise memory arrays. The memory controller 706 can be configured to control operations of the memory device 704, such as read, erase, and program operations. The memory controller 706 can also be configured to manage various functions with respect to the data stored or to be stored in the memory device 704 including, but not limited to bad-block management, garbage collection, logical-to-physical address conversion, wear leveling, etc.

In some implementations, the memory controller 706 is further configured to process an error correction code (ECC) with respect to the data read from or written to the memory device 704. Any other suitable functions may be performed by the memory controller 706 as well, for example, formatting the memory device 704. The memory controller 706 can communicate with an external device (e.g., the host 708) according to a particular communication protocol. For example, the memory controller 706 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 8A:
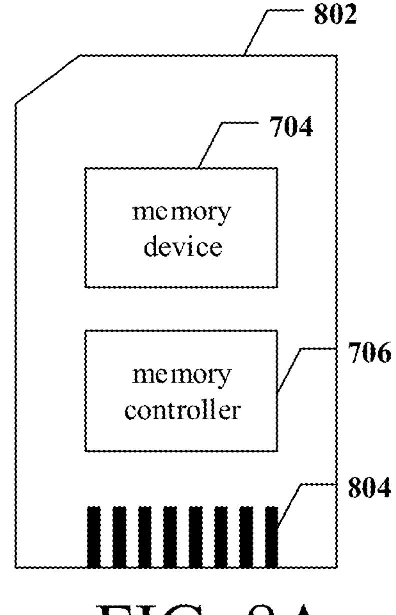
FIG. 8A is a schematic diagram illustrating an example memory card having a memory system according to an implementation of the present disclosure.
Figure 8B:
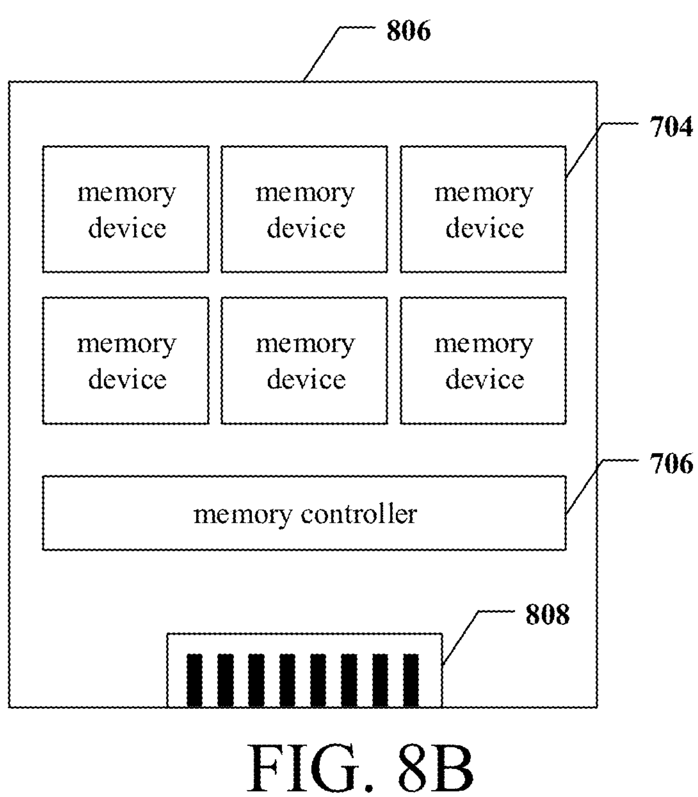
FIG. 8B is a schematic diagram illustrating an example solid state drive having a memory system according to an implementation of the present disclosure.

Memory controller 706 and one or more memory devices 704 can be integrated into various types of storage apparatuses, for example, be included in the same package structure, such as a universal Flash storage (UFS) package or an eMMC package. The package structure may include the package structure 100 as shown in FIGS. 1A to 1C and FIG. 5. That is, the memory system 702 can be implemented and packaged into different types of end electronic products. In one example as shown in FIG. 8A, the memory controller 706 and a single memory device 704 can be integrated into a memory card 802. The memory card 802 may include a PC card (PCMCIA, Personal Computer Memory Card International Association), a CF card, a smart media (SM) card, a memory stick, a multimedia card (MMC, RS-MMC, MMC-micro), a SD card (SD, miniSD, microSD, SDHC), a UFS, etc. The memory card 802 may also include a memory card connector 804 coupling the memory card 802 with the host (e.g., the host 708 in FIG. 7). In another example as shown in FIG. 8B, the memory controller 706 and multiple memory devices 704 can be integrated into an SSD 806. SSD 806 can further include an SSD connector 808 coupling the SSD 806 with the host (e.g., the host 708 in FIG. 7). In some implementations, the storage capacity and/or the operation speed of the SSD 806 is greater than those of the memory card 802. The package form and protocols to be implemented for the memory controller and the memory device are not limited in implementations of the present disclosure and may be selected and optimized according to a host interface protocol and user's practical requirements.

Figure 9:
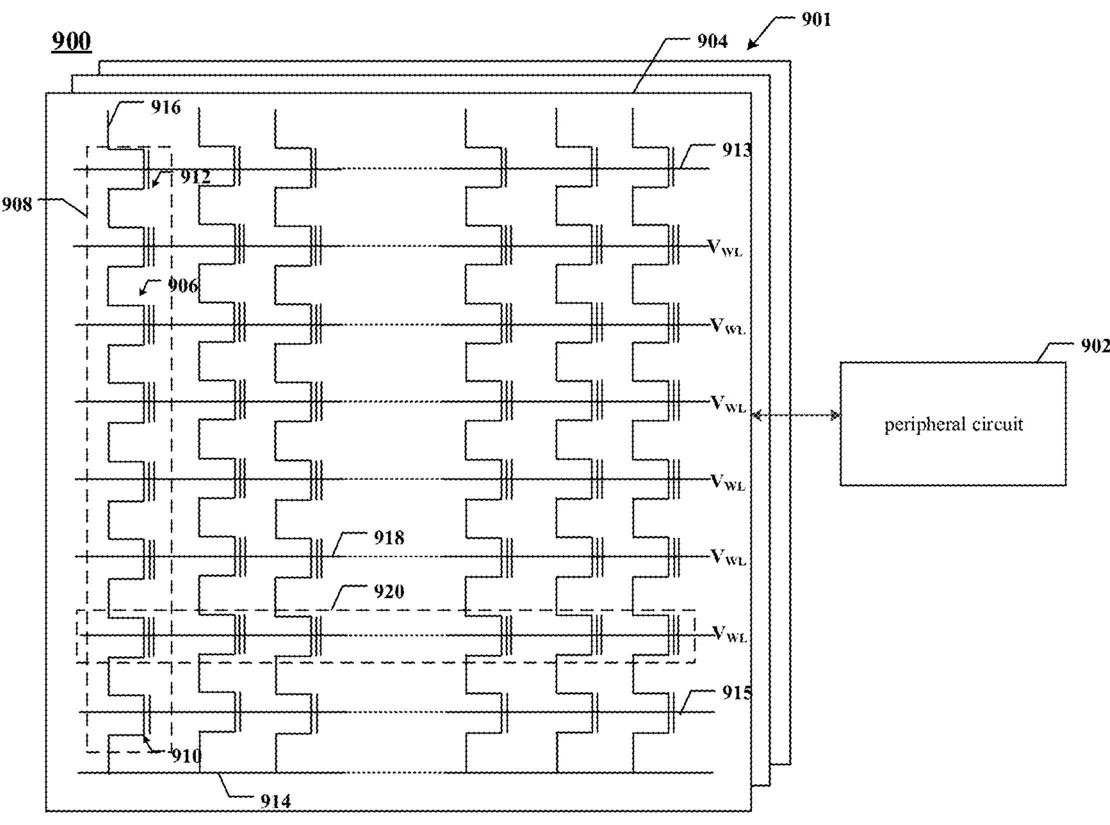
FIG. 9 is a schematic diagram illustrating an example memory device including a peripheral circuit according to an implementation of the present disclosure.

FIG. 9 shows a schematic circuit diagram of an example memory device 900 including a peripheral circuit according to some aspects of implementations of the present disclosure. The memory device 900 may be an example of the memory device 704 in FIG. 7. The memory device 900 may include a memory array 901 and a peripheral circuit 902 coupled to the memory array 901. The memory array 901 may be a NAND flash memory array, wherein memory cells 906 are provided in the form of an array of NAND memory strings 908, and each NAND memory string 908 extends vertically over the substrate (not shown).

In some implementations, each NAND memory string 908 includes a plurality of memory cells 906 coupled in series and stacked vertically. Each memory cell 906 may remain a continuous analog value, for example, a voltage or charge, depending on the number of electrons trapped in the region of the memory cell 906. Each memory cell 906 may be a memory cell of a floating-gate type that includes a floating-gate transistor or a memory cell of a charge trapping type that includes a charge trapping transistor.

In some implementations, each memory cell 906 is a single-level cell (SLC) that has two possible memory states and can therefore store one bit of data. For example, the first memory state "0" may correspond to the first voltage range, and the second memory state "1" may correspond to the second voltage range. In some implementations, each memory cell 906 is a multi-level cell (MLC) that can store more than one bit of data in more than four memory states. For example, an MLC may store two bits per cell, three bits per cell (also known as a triple-level cell (TLC)) or four bits per cell (also known as a quad-level cell (QLC)), etc. Each MLC may be programmed to assume a possible range of nominal storage values. In one example, if each MLC stores two bits of data, then the MLC may be programmed to write one of three possible nominal storage values into the cell, and the fourth nominal storage value other than the three ones may be used to indicate the erase state.

As shown in FIG. 9, each NAND string 908 may include a source select gate (SSG) 910 at its source end and a drain select gate (DSG) 912 at its drain end. SSG 910 and DSG 912 may be configured to activate the selected NAND memory string 908 (a column of the array) in the reading and programming operations. In some implementations, sources of NAND memory strings 908 in the same block 904 are coupled by the same source line (SL) 914, such as the common SL.

According to some implementations, all NAND memory strings 908 in the same block 904 have an array common source (ACS). According to some implementations, DSG 912 of each NAND memory string 908 is coupled to a corresponding bit line 916, and data may be read from or written into the bit line 916 via an output bus (not shown). In some implementations, each NAND memory string 908 is configured to be selected or deselected by applying a select voltage (for example higher than the threshold voltage of the transistor having DSG 912) or a deselect voltage (for example, 0V) to the corresponding DSG 912 via one or more DSG lines 913 and/or applying a select voltage (for example higher than the threshold voltage of the transistor having SSG 910) or a deselect voltage (for example, 0V) to the corresponding SSG 910 via one or more SSG lines 915.

As shown in FIG. 9, the NAND memory strings 908 may be organized into a plurality of blocks 904 and each block 404 may have a common source line 914 (coupled to ground for example). In some implementations, each block 904 is the basic data unit for erase operation. That is, all memory cells 906 on the same block 904 are erased at the same time. In order to erase the memory cells 906 in a selected block 904, it is possible to bias the source line 914 coupled to the selected block 904 and the unselected blocks 904 in the same plane as the selected block 904 with an erase voltage (Vers) (for example, a high positive voltage such as 20V or higher).

It will be appreciated that in some examples, it is possible to execute an erase operation on the semi-block level, the quarter-block level, or a level of any suitable number of blocks or any suitable fraction of a block. Memory cells 906 in adjacent NAND memory strings 908 may be coupled via the word line 918 that chooses which row of the memory cells 906 is subject to the reading and programming operations. In some implementations, each word line 918 is coupled to a page 920 of memory cells 906, which is the basic data unit for programming operation. The size of a page 920 in bits may be relevant to the number of NAND memory strings 908 in a block 904 that are coupled by the word line 918. Each word line 918 may include a plurality of control gates (gate electrodes) at each memory cell 906 in the respective page 920 and gate lines for coupling the control gates. The page 920 shown in FIG. 9 may include a row of memory cells 906 and may also include a plurality rows of memory cells 906 on the same layer sharing one word line voltage.

Referring back to FIG. 9, the peripheral circuit 902 may be coupled to the memory array 901 through the bit line 916, the word line 918, the source line 914, the SSG line 915 and the DSG line 913. The peripheral circuit 902 may include any suitable analog, digital and hybrid signal circuits for facilitating operation of the memory array 901 by applying voltage signals and/or current signals to each target memory cell 906 via the bit line 916, word line 918, source line 914, SSG line 915 and DSG line 913 and sensing voltage signals and/or current signals from each target memory cell 906. The peripheral circuit 902 may include various types of peripheral circuits formed by a metal-oxide-semiconductor (MOS) technology. The memory array 901 may include a plurality of arranged channel posts, may also include a plurality of arranged channel posts. The arrangement and number are not limited in the implementation of the present disclosure.

Figure 10:
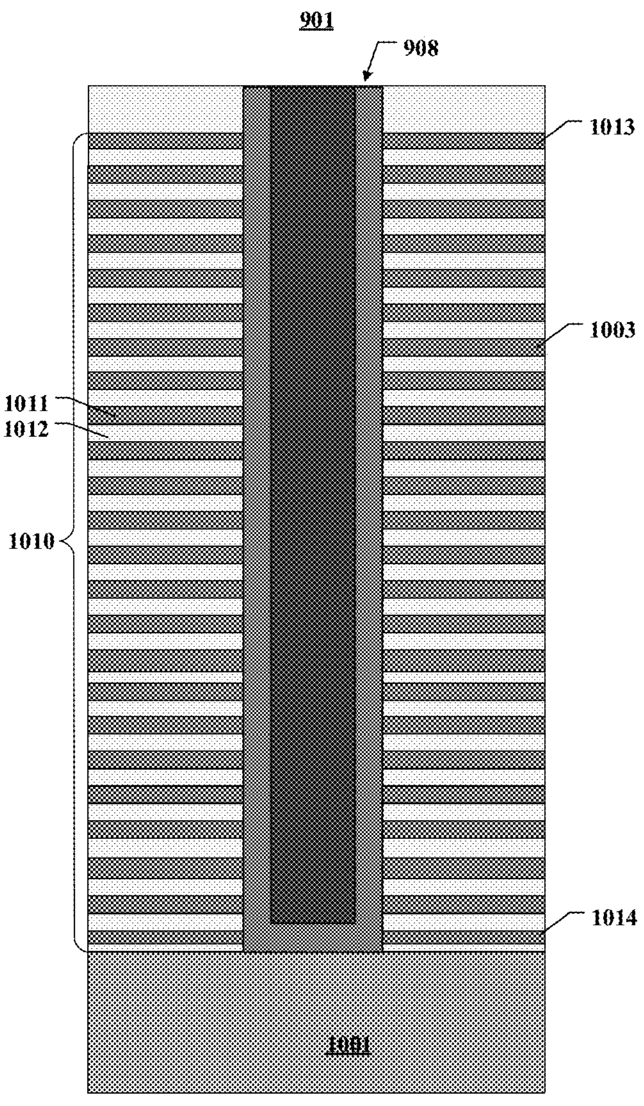
FIG. 10 is a schematic diagram illustrating a section of a memory array including a NAND memory string according to an implementation of the present disclosure.

FIG. 10 shows a schematic diagram of a section of an example memory array 901 including a NAND memory string 908 according to some aspects of the present disclosure. As shown in FIG. 10, the NAND memory string 908 may include a stack 1010 including a plurality of gate layers 1011 and a plurality of dielectric layers 1012 stacked alternatively and the memory string 908 penetrating through the gate layers 1011 and the dielectric layers 1012 vertically. The gate layers 1011 and the dielectric layers 1012 may be stacked alternatively, and adjacent two gate layers 1011 are separated by a dielectric layer 1012. The number of the pairs of gate layers 1011 and dielectric layers 1012 in the stack 1010 may determine the number of the memory cells included in the memory array 901.

The gate layers 1011 may include a conductive material. The conductive material may include, but is not limited to, tungsten (W), cobalt (Co), copper (Cu), aluminum (Al), polysilicon, doped silicon, silicide or any combination thereof. In some implementations, each gate layer 1011 includes a metal layer such as a tungsten layer. In some implementations, each gate layer 1011 includes a doped polysilicon layer. Each gate layer 1011 may include a control gate surrounding the memory cell. The gate layer 1011 on top of the stack 1010 may extend laterally as a top select gate line, the gate layer 1011 at the bottom of the stack 1010 may extend laterally as a bottom select gate line, and the gate layers 1011 extending laterally between the top select gate line and the bottom select gate line may serve as word line layers.

In some implementations, the stack 1010 may be disposed on a substrate 1001. The substrate 1001 may include silicon (e.g., single crystalline silicon), silicon germanium (SiGe), gallium arsenide (GaAs), germanium (Ge), silicon-on-insulator (SOI), germanium-on-insulator (GOI) or any other suitable material.

In some implementations, the NAND memory string 908 includes a channel structure extending vertically through the stack 1010. In some implementations, the channel structure includes a channel hole filled with the semiconductor material(s) (e.g., serving as the semiconductor channel) and the dielectric material(s) (e.g., serving as the memory film). In some implementations, the semiconductor channel includes silicon, such as polysilicon. In some implementations, the memory film is a composite dielectric layer including a tunneling layer, a storage layer (also known as "charge trapping/storage layer") and a blocking layer. The channel structure may have a cylindrical shape (e.g., a pillar shape). According to some implementations, the semiconductor channel, the tunneling layer, the storage layer and the blocking layer are arranged radially from the center of the pillar towards the outer surface of the pillar in this order. The tunneling layer may include silicon oxide, silicon oxynitride or any combination thereof. The storage layer may include silicon nitride, silicon oxynitride or any combination thereof. The blocking layer may include silicon oxide, silicon oxynitride, high dielectric constant (high-k) dielectric or any combination thereof. In one example, the memory film may include a composite layer of silicon oxide/silicon oxynitride/silicon oxide (ONO).

Figure 11:
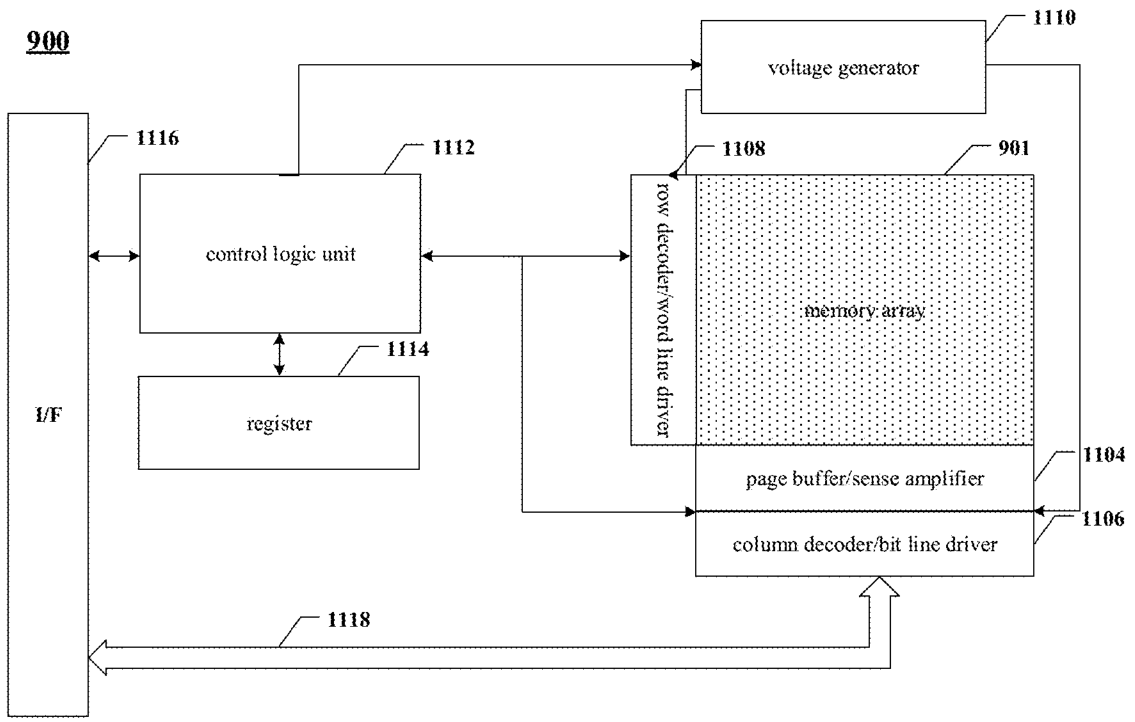
FIG. 11 is a schematic diagram illustrating an example memory device including a memory array and a peripheral circuit according to an implementation of the present disclosure.

In some implementations, FIG. 11 shows some example peripheral circuits. The peripheral circuit 902 includes a page buffer/sense amplifier 1104, a column decoder/bit line driver 1106, a row decoder/word line driver 1108, a voltage generator 1110, a control logic unit 1112, a register 1114, an interface (I/F) 1116, and a data bus 1118. It should be understood that in some examples, additional peripheral circuits not shown in FIG. 11 may be further included.

The page buffer/sense amplifier 1104 may be configured to read data from the memory array 901 and program (write) data to the memory array 901 according to control signals from the control logic unit 1112. In one example, the page buffer/sense amplifier 1104 may store a page of programming data (writing data) to be programed into a page 920 of the memory array 901. In another example, the page buffer/sense amplifier 1104 may execute the programming verification operation to ensure that the data has been properly programed into the memory cell 906 coupled to the selected word line 918. In yet another example, the page buffer/sense amplifier 1104 may also sense a low-power signal from a bit line 916 indicating the data bit stored in a memory cell 906 and amplify the small voltage swing to an identifiable logic level in the read operation. The column decoder/bit line driver 1106 may be configured to be controlled by the control logic unit 1112 and select one or more NAND memory strings 908 by applying a bit line voltage generated by the voltage generator 1110.

The row decoder/word line driver 1108 may be configured to be controlled by the control logic unit 1112 and select/deselected a block 904 of the memory array 901 and select/deselect a word line 918 for the block 904. The row decoder/word line driver 1108 may be further configured to drive a word line 918 using a word line voltage generated by the voltage generator 1110. In some implementations, the row decoder/word line driver 1108 may also select/deselect and drive SSG lines 915 and DSG lines 913. As detailed below, the row decoder/word line driver 1108 is configured to execute an erase operation on the memory cells 906 coupled to the selected word line(s) 918. The voltage generator 1110 may be configured to be controlled by the control logic unit 1112 and generate the word line voltage (for example, read voltage, program voltage, pass voltage, local voltage, verification voltage, etc.), the bit line voltage and the source line voltage to be provided to the memory array 901.

The control logic unit 1112 may be coupled to each of the peripheral circuits described above and configured to control operations of each of the peripheral circuits. The register 1114 may be coupled to the control logic unit 1112 and include a status register, a command register and an address register to store status information, command operation code (OP code) and command address for controlling operations of each of the peripheral circuits. The interface 1116 may be coupled to the control logic unit 1112 and serve as a control buffer to buffer a control command received from the host (not shown) and relay the control command to the control logic unit 1112, and to buffer status information received from the control logic unit 1112 and relay the status information to the host. The interface 1116 may be further coupled to the column decoder/bit line driver 1106 via the data bus 1118 and serve as a data I/O interface and a data buffer to buffer data and relay the data to the memory array 901 or relay or buffer data from the memory array 901.

Figure 12:
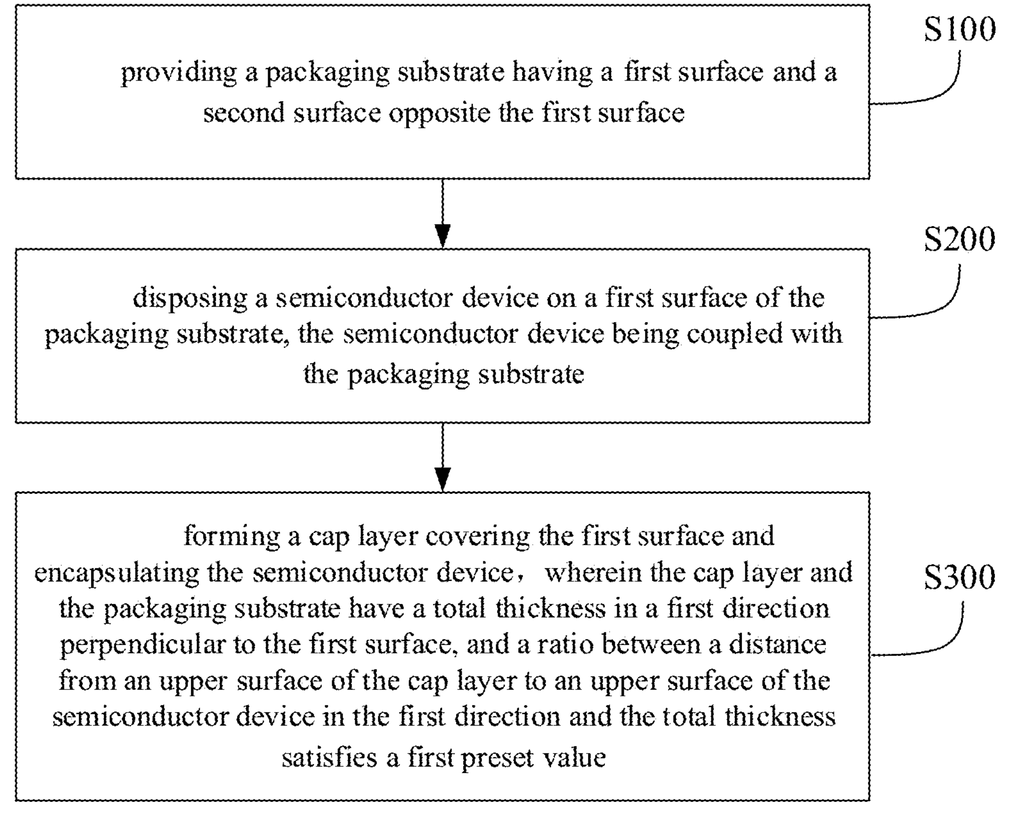
FIG. 12 is a flow schematic diagram illustrating a fabricating method of a package structure according to an implementation of the present disclosure.

According to some aspects of the implementations of the present disclosure, there is provided a fabricating method of a package structure. As shown in FIG. 12, the fabricating method includes: S100: referring to FIG. 13A, providing a packaging substrate 110 having a first surface and a second surface opposite the first surface; S200: referring to FIG. 13B, disposing a semiconductor device 120 on the first surface of the packaging substrate 110, the semiconductor device 120 being coupled with the packaging substrate 110; S300: referring to FIG. 13C, forming a cap layer 130 covering the first surface and encapsulating the semiconductor device 120, wherein the cap layer 130 and the packaging substrate 110 have a total thickness in a first direction perpendicular to the first surface, and a ratio between a distance from an upper surface of the cap layer 130 to an upper surface of the semiconductor device 120 in the first direction and the total thickness satisfies a first preset value.

Figure 13A:
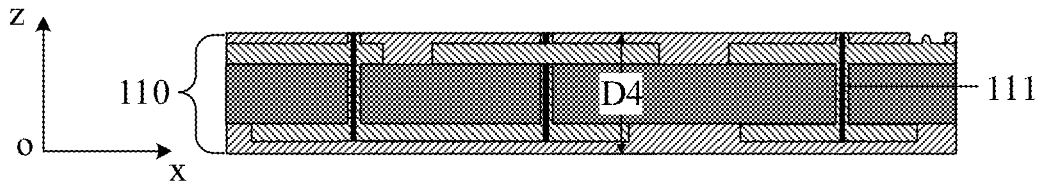
FIGS. 13A to 13D are schematic diagrams illustrating a fabricating method of a package structure according to an implementation of the present disclosure.
Figure 13B:
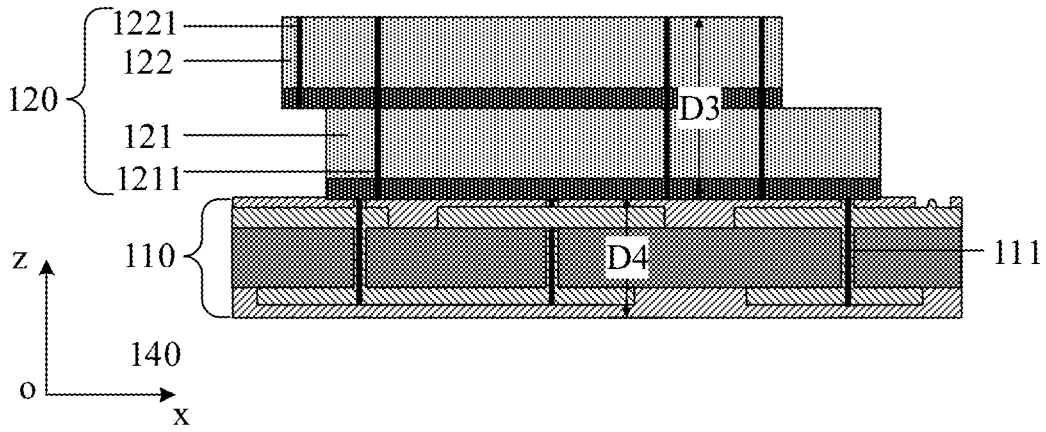

As shown in FIG. 13A, the packaging substrate 110 is provided, and may provide a mechanical support for the semiconductor device 120 and may also provide a power supply structure for the semiconductor device 120. Illustratively, the packaging substrate 110 may include a semiconductor material, such as a silicon substrate, a germanium substrate, or the like, and may further include an organic resin, glass, a ceramic material, or the like. A power supply network may be disposed on the packaging substrate 110 for powering the semiconductor device 120.

The forming the cap layer may include potting an insulating material and performing a cutting after the potting to form a regular cap layer. The cap layer may include resin, plastics or silicone gel, and the shape of the cap layer may include cube or cuboid. The cap layer may further include a thermally conductive material such as an organosilicon thermally conductive material for heat dissipation.

In some implementations, referring to FIG. 5, the fabricating method also includes forming a conductive ball 140 on the lower surface of the packaging substrate 110.

In some implementations, the pressure strain of the package structure 100 satisfies the second preset value. In some implementations, the fabricating method further includes performing a pressure strain test on multiple package structures 100 to establish a monotonous relationship between the pressure strain and the ratio and determine the first preset value and the second preset value according to the monotonous relationship. The package structure 100 for bending test may include the conductive ball 140 or may not include the conductive ball 140. The thickness of the conductive ball 140 accounts for a smaller proportion with respect to the total thickness of the package structure 100 and has a negligible effect on the pressure test result.

Figure 13C:
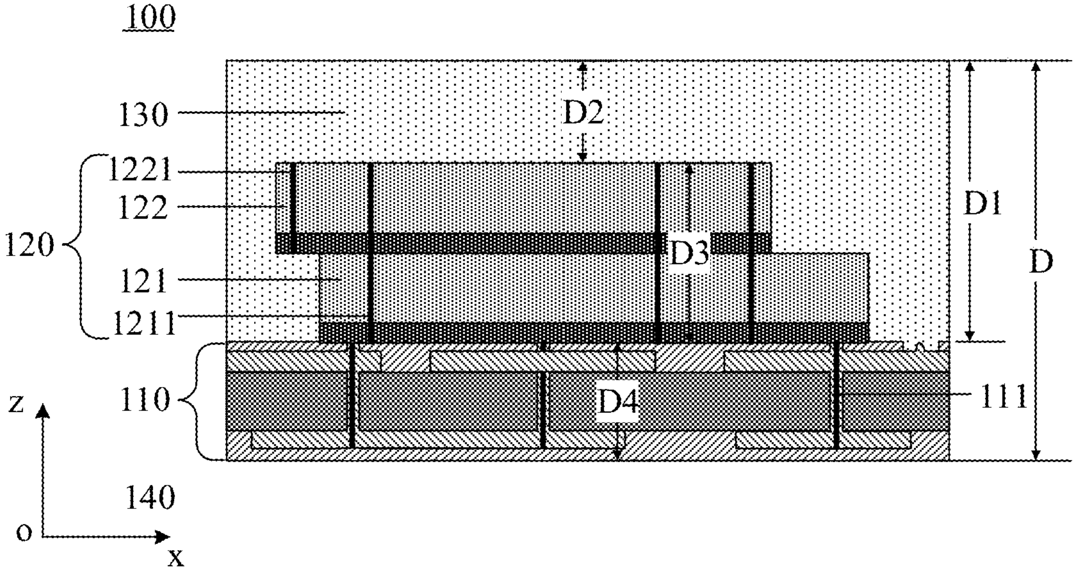

In some implementations, the total thickness of the package structure 100 without the conductive ball 140 in FIG. 13C comprises 500 microns to 900 microns; and the total thickness of the package structure with the conductive ball 140 in FIG. 5 or FIGS. 1A to 1C comprises 800 microns to 1000 microns.

In some implementations, the first preset value is in the range of 0.22 to 0.45, and the second preset value is greater than 7000 ue.

In some implementations, the semiconductor device 120 includes one or more semiconductor dies coupled with each other, and in implementations of the present disclosure, the fabricating method further includes adjusting the thickness of the semiconductor device 120 or the thickness of the cap layer 130 to enable $\eta$ to satisfy the first preset value. For example, the thickness of the semiconductor device 120 is measured before packaging the semiconductor device 120 and is adjusted by thinning a substrate of the semiconductor device 120. The thickness of the cap layer 130 is then obtained by also considering the thickness of the packaging substrate 110 and the first preset value and may be in a range of values. The thickness of the cap layer 130 is measured after forming the cap layer 130. If the thickness is too large, the cap layer 130 is thinned by a cutting or grinding process. If the thickness is too small, the cap layer 130 is thickened or the cap layer 130 is removed and re-formed. The thinning process may include, but not limited to an etch, cam grinding or chemical mechanical grinding.

In some implementations, the forming the semiconductor device 120 includes providing a first semiconductor die 121 including a first bonding layer having a plurality of first bonding contacts; providing a second semiconductor die 122 including a second bonding layer having a plurality of second bonding contacts; and bonding the first bonding layer with the second bonding layer, wherein the first semiconductor die 121 is coupled with the second semiconductor die 122 through the first bonding contacts and the second bonding contacts.

Referring to FIG. 13A, the semiconductor device 120 may include a plurality of semiconductor dies, and bonding faces of the semiconductor dies may be fabricated before fabricating the package structure 100. Upon the bonding, a first wafer including a plurality of first semiconductor dies 121 may be bonded with a second wafer including a plurality of second semiconductor dies 122. The bonding may include a hybrid bonding. The bonding layer includes bonding contacts and an insulating dielectric layer. The two wafers are in electrical communication via the conductive bonding contacts, and the insulating dielectric layer provides electrical isolation and a larger bonding surface for an improved bonding force. Electrical signals of the first semiconductor dies 121 and the second semiconductor dies 122 are led out to bonding contacts for interconnection. The first semiconductor dies 121 are coupled with the packaging substrate 110 for powering the first semiconductor dies 121 and the second semiconductor dies 122. After completing the wafer bonding, the bonded wafers are cut to form semiconductor devices 120. In some other implementations, a lead may be provided to couple the contact on the upper surface of the second semiconductor dies 122 with the packaging substrate 110 for powering the second semiconductor dies 122.

In some implementations, the fabricating method further includes forming a power supply network on the first surface of the packaging substrate 110 and/or in the packaging substrate 110, wherein the power supply network is coupled with the semiconductor device 120.

The power supply network may be provided by the packaging substrate 110, or may be formed on the upper surface of the packaging substrate 110 or in the packaging substrate 110 before disposing the semiconductor device 120. Illustratively, the packaging substrate 110 is etched to form a groove in which a conductive material is deposited to form a conductive structure such as a wiring layer, a conductive plug, or the like, thereby forming the power supply network. In some implementations, after forming the groove, an insulating material is deposited on inner walls of the groove, then a conductive material is deposited to form the power supply network such that the power supply network is electrically isolated from the packaging substrate 110.

Figure 13D:
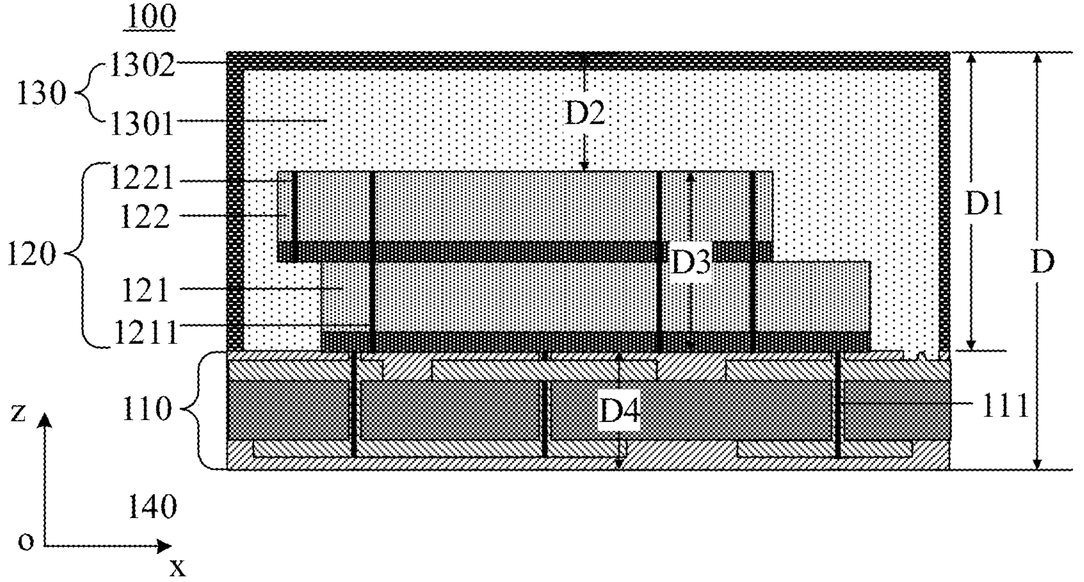

In some implementations, referring to FIG. 13D, the forming the cap layer 130 includes forming an insulating layer 1301 covering and encapsulating the semiconductor device 120; and forming a conductive layer 1302 encapsulating the insulating layer 1301; wherein the conductive layer 1302 is grounded.

In some implementations, the conductive layer 1302 may be coupled with the ground line in the power supply network to be grounded, or the conductive layer 1302 may be coupled with the ground terminal on the upper surface of the packaging substrate 110 to be grounded.

The forming the insulating layer 1301 may include potting or molding an insulating material and performing a cutting after the potting to form a regular insulating layer 1301. The insulating layer 1301 may include resin, plastics or silicone gel, and a shape of the insulating layer 1301 may include cube or cuboid. The insulating layer 1301 may further include a thermally conductive material such as an organosilicon thermally conductive material for heat dissipation. A conductive material is deposited, plated, or sputtered on the surface of the insulating layer 1301 to form a conductive layer 1302. The conductive layer 1302 forms a Faraday ring (or quasi-Faraday ring) to reduce an electromagnetic interference and is coupled with the ground line to release electrons on the surface via the ground line, thereby reducing electrostatic interference and improving stability of the semiconductor device 120. The conductive layer 1302 may also function to dissipate heat.

In some implementations, the fabricating method further includes forming a conductive ball 140 on the second surface of the packaging substrate 110 that is coupled with the semiconductor device 120.

Illustratively, a pad is disposed by a surface laminating process on the lower surface of the packaging substrate 110. Solder material is disposed on the pad by a ball implantation process and is molten and cooled by a reflow process to form the conductive ball 140. The arrangement and size of the conductive balls 140 may be controlled by the pads.

According to a first aspect of the implementations of the present disclosure, there is provided a package structure comprising: a packaging substrate having a first surface and a second surface opposite the first surface; a semiconductor device on the first surface of the packaging substrate and coupled with the packaging substrate; and a cap layer covering the first surface and encapsulating the semiconductor device, wherein the cap layer and the packaging substrate have a total thickness in a first direction perpendicular to the first surface, and a ratio between a distance from an upper surface of the cap layer to an upper surface of the semiconductor device in the first direction and the total thickness satisfies a first preset value.

In some implementations, a pressure strain of the package structure satisfies a second preset value.

In some implementations, there is a monotonous relationship between the pressure strain and the ratio, and the first preset value and the second preset value are determined according to the monotonous relationship.

In some implementations, the first preset value is in a range of 0.22 to 0.45, and the second preset value is greater than 7000 ue.

In some implementations, the total thickness of the cap layer and the packaging substrate in the first direction comprises 500 microns to 750 microns.

In some implementations, the semiconductor device comprises a plurality of semiconductor dies coupled with each other.

In some implementations, the semiconductor device comprises: a first semiconductor die comprising a first bonding layer having a plurality of first bonding contacts; and a second semiconductor die comprising a second bonding layer having a plurality of second bonding contacts, wherein the first bonding layer is bonded with the second bonding layer, and the first semiconductor die is coupled with the second semiconductor die through the first bonding contacts and the second bonding contacts.

In some implementations, the package structure further comprises a first conductive channel penetrating through the first semiconductor die and coupled with the first bonding contact.

In some implementations, the package structure further comprises a second conductive channel penetrating through the second semiconductor die and coupled with the second bonding contact.

In some implementations, the cap layer comprises an insulating layer and a conductive layer, wherein the conductive layer encapsulates the insulating layer.

In some implementations, the package structure further comprises a power supply network on the first surface and/or in the packaging substrate, the power supply network is coupled with the semiconductor device, and the conductive layer is coupled with a ground line in the power supply network.

In some implementations, the package structure further comprises a conductive ball on the second surface and coupled with the semiconductor device.

According to a second aspect of implementations of the present disclosure, there is provided a memory system comprising the package structure as described in any of the above implementations; wherein the semiconductor device comprises a memory controller and a memory device coupled therewith, and the memory controller is configured to control the memory device.

According to a third aspect of the implementations of the present disclosure, there is provided a fabricating method of a package structure comprising: providing a packaging substrate having a first surface and a second surface opposite the first surface; disposing a semiconductor device on the first surface of the packaging substrate, the semiconductor device being coupled with the packaging substrate; and forming a cap layer covering the first surface and encapsulating the semiconductor device, wherein the cap layer and the packaging substrate have a total thickness in a first direction perpendicular to the first surface, and a ratio between a distance from an upper surface of the cap layer to an upper surface of the semiconductor device in the first direction and the total thickness satisfies a first preset value.

In some implementations, a pressure strain of the package structure satisfies a second preset value.

In some implementations, the first preset value is in a range of 0.22 to 0.45, and the second preset value is greater than 7000 ue.

In some implementations, the semiconductor device comprises one semiconductor die or more semiconductor dies coupled with each other, and the fabricating method further comprises thinning substrates of the semiconductor die such that a thickness of the semiconductor device satisfies the first preset value.

In some implementations, forming the semiconductor device comprises: providing a first semiconductor die comprising a first bonding layer having a plurality of first bonding contacts; providing a second semiconductor die comprising a second bonding layer having a plurality of second bonding contacts; and bonding the first bonding layer with the second bonding layer, wherein the first semiconductor die is coupled with the second semiconductor die through the first bonding contacts and the second bonding contacts.

In some implementations, forming the cap layer comprises: forming an insulating layer covering and encapsulating the semiconductor device; and forming a conductive layer encapsulating the insulating layer, wherein the conductive layer is grounded.

In some implementations, the fabricating method further comprises forming a conductive ball on the second surface, the conductive ball being coupled with the semiconductor device.

The package structure according to the implementations of the present disclosure comprises a semiconductor device on a first surface of a packaging substrate and coupled with the packaging substrate; and a cap layer covering the first surface of the packaging substrate and encapsulating the semiconductor device, wherein the cap layer and the packaging substrate have a total thickness in a first direction perpendicular to the first surface, and a ratio between a distance from an upper surface of the cap layer to an upper surface of the semiconductor device in the first direction and the total thickness is increased to satisfy a first preset value, such that a pressure strain of the package structure is improved without changing a thickness of the packaging substrate and the total thickness of the package structure, for making the package structure be capable of withstanding a larger bending deformation, thereby enhancing a packaging strength and an operation stability of the semiconductor device.

What has been described above are only implementations of the present disclosure. However, the scope of the present disclosure is not limited thereto, and variations or substitutions that easily occur to those skilled in the art based upon the technical scope disclosed by the present disclosure should be encompassed by the scope of the present disclosure. Therefore, the scope of the present disclosure should be determined by the scope of the claims.

What is claimed is:

1. A package structure, comprising:

a packaging substrate having a first surface and a second surface opposite the first surface;

a semiconductor device on the first surface of the packaging substrate and coupled with the packaging substrate; and a cap layer covering the first surface and encapsulating the semiconductor device, wherein the cap layer and the packaging substrate have a total thickness in a first direction perpendicular to the first surface, a ratio between a distance from an upper surface of the cap layer to an upper surface of the semiconductor device in the first direction and the total thickness satisfies a first preset value, and wherein a pressure strain of the package structure satisfies a second preset value.

2. The package structure of claim 1, wherein there is a monotonous relationship between the pressure strain and the ratio, and the first preset value and the second preset value are determined according to the monotonous relationship.

3. The package structure of claim 1, wherein the first preset value is in a range of 0.22 to 0.45, and the second preset value is greater than 7000 ue.

4. The package structure of claim 1, wherein the total thickness of the cap layer and the packaging substrate in the first direction comprises 500 microns to 750 microns.

5. The package structure of claim 1, wherein the semiconductor device comprises a plurality of semiconductor dies coupled with each other.

6. The package structure of claim 1, wherein the semiconductor device comprises:

a first semiconductor die comprising a first bonding layer having a plurality of first bonding contacts; and a second semiconductor die comprising a second bonding layer having a plurality of second bonding contacts, wherein the first bonding layer is bonded with the second bonding layer, and the first semiconductor die is coupled with the second semiconductor die through the first bonding contacts and the second bonding contacts.

7. The package structure of claim 6, further comprising a first conductive channel penetrating through the first semiconductor die and coupled with a first bonding contact of the first bonding contacts.

8. The package structure of claim 6, further comprising a second conductive channel penetrating through the second semiconductor die and coupled with a second bonding contact of the second bonding contacts.

9. The package structure of claim 1, wherein the cap layer comprises an insulating layer and a conductive layer, and wherein the conductive layer encapsulates the insulating layer.

10. The package structure of claim 9, further comprising a power supply network on the first surface and/or in the packaging substrate, wherein the power supply network is coupled with the semiconductor device, and wherein the conductive layer is coupled with a ground line in the power supply network.

11. The package structure of claim 1, further comprising a conductive ball on the second surface and coupled with the semiconductor device.

12. A memory system, comprising a package structure comprising:

a packaging substrate having a first surface and a second surface opposite the first surface;

a semiconductor device on the first surface of the packaging substrate and coupled with the packaging substrate; and a cap layer covering the first surface and encapsulating the semiconductor device, wherein the cap layer and the packaging substrate have a total thickness in a first direction perpendicular to the first surface, a ratio between a distance from an upper surface of the cap layer to an upper surface of the semiconductor device in the first direction and the total thickness satisfies a first preset value, a pressure strain of the package structure satisfies a second preset value, and wherein the semiconductor device comprises a memory controller and a memory device coupled thereto, the memory controller being configured to control the memory device.

13. The memory system of claim 12, wherein there is a monotonous relationship between the pressure strain and the ratio, and the first preset value and the second preset value are determining according to the monotonous relationship.

14. The memory system of claim 12, wherein the first preset value is in a range of 0.22 to 0.45, and the second preset value is greater than 7000 ue.

15. A method of fabricating a package structure, comprising:

providing a packaging substrate having a first surface and a second surface opposite the first surface;

disposing a semiconductor device on the first surface of the packaging substrate, the semiconductor device being coupled with the packaging substrate; and forming a cap layer covering the first surface and encapsulating the semiconductor device, wherein the cap layer and the packaging substrate have a total thickness in a first direction perpendicular to the first surface, a ratio between a distance from an upper surface of the cap layer to an upper surface of the semiconductor device in the first direction and the total thickness satisfies a first preset value, and a pressure strain of the package structure satisfies a second preset value.

16. The method of claim 15, wherein the first preset value is in a range of 0.22 to 0.45, and wherein the second preset value is greater than 7000 ue.

17. The method of claim 15, wherein the semiconductor device comprises one or more semiconductor dies coupled with each other, and wherein the method further comprises thinning a substrate of the one or more semiconductor dies such that a thickness of the semiconductor device satisfies the first preset value.

18. The method of claim 15, wherein forming the semiconductor device comprises:

providing a first semiconductor die comprising a first bonding layer having a plurality of first bonding contacts;

providing a second semiconductor die comprising a second bonding layer having a plurality of second bonding contacts; and bonding the first bonding layer with the second bonding layer, wherein the first semiconductor die is coupled with the second semiconductor die through the first bonding contacts and the second bonding contacts.

19. The method of claim 15, wherein the forming the cap layer comprises:

forming an insulating layer covering and encapsulating the semiconductor device; and forming a conductive layer encapsulating the insulating layer, wherein the conductive layer is grounded.

20. The method of claim 15, further comprising forming a conductive ball on the second surface, the conductive ball being coupled with the semiconductor device.

* * * * *